(12) United States Patent
Bae et al.

(10) Patent No.: US 11,500,031 B2
(45) Date of Patent: Nov. 15, 2022

(54) BATTERY STATE ESTIMATING APPARATUS

(71) Applicant: LG Chem, Ltd., Seoul (KR)

(72) Inventors: Yoon-Jung Bae, Daejeon (KR);
Hye-Jin Kang, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/272,381

(22) PCT Filed: Feb. 28, 2020

(86) PCT No.: PCT/KR2020/002902
§ 371 (c)(1),
(2) Date: Mar. 1, 2021

(87) PCT Pub. No.: WO2020/189919
PCT Pub. Date: Sep. 24, 2020

(65) Prior Publication Data
US 2021/0325475 A1 Oct. 21, 2021

(30) Foreign Application Priority Data

Mar. 18, 2019 (KR) .................. 10-2019-0030710

(51) Int. Cl.
*G01R 31/392* (2019.01)
*G01R 31/3835* (2019.01)
(52) U.S. Cl.
CPC ....... *G01R 31/392* (2019.01); *G01R 31/3835* (2019.01)
(58) Field of Classification Search
None
See application file for complete search history.

(56) References Cited

U.S. PATENT DOCUMENTS

| 2007/0252600 A1 | 11/2007 | Chou et al. |
| 2010/0042345 A1 | 2/2010 | Kang et al. |

(Continued)

FOREIGN PATENT DOCUMENTS

| JP | 2005172784 A | 6/2005 |
| JP | 2006015914 A | 1/2006 |

(Continued)

OTHER PUBLICATIONS

Extended European Search Report including Written Opinion for Application No. 20772792.6 dated Oct. 6, 2021, pp. 1-6.

(Continued)

*Primary Examiner* — Jas A Sanghera
(74) *Attorney, Agent, or Firm* — Lerner, David, Littenberg, Krumholz & Mentlik, LLP

(57) ABSTRACT

A battery state estimating apparatus including a voltage measuring unit configured to measure a voltage of a battery cell and measure an open circuit voltage (OCV) of the battery cell whenever the measured voltage reaches a reference charge voltage, and a control unit configured to receive the OCV measured by the voltage measuring unit, calculate a voltage fluctuation rate based on a result obtained by processing the received OCV, determine a voltage increase and decrease pattern based on the calculated voltage fluctuation rate and pre-stored voltage fluctuation rate data, and determine a degradation acceleration degree of the battery cell according to the determined voltage increase and decrease pattern.

14 Claims, 7 Drawing Sheets

(56) References Cited

U.S. PATENT DOCUMENTS

| | | | |
|---|---|---|---|
| 2010/0156351 A1* | 6/2010 | Ugaji | G01R 31/392 |
| | | | 320/132 |
| 2013/0069598 A1 | 3/2013 | Tanaka et al. | |
| 2013/0218496 A1 | 8/2013 | Koch et al. | |
| 2013/0314050 A1 | 11/2013 | Matsubara et al. | |
| 2015/0268309 A1 | 9/2015 | Kim | |
| 2016/0097819 A1* | 4/2016 | Oh | G01R 31/389 |
| | | | 324/430 |
| 2016/0190658 A1 | 6/2016 | Ishibashi et al. | |
| 2017/0146609 A1 | 5/2017 | Uchino et al. | |
| 2018/0080990 A1 | 3/2018 | Seo | |
| 2018/0299511 A1* | 10/2018 | Kim | G01R 31/392 |
| 2019/0219641 A1 | 7/2019 | Iwane et al. | |
| 2021/0318388 A1* | 10/2021 | Bae | H01M 10/48 |

FOREIGN PATENT DOCUMENTS

| | | | |
|---|---|---|---|
| JP | 2009226996 A | 10/2009 | |
| JP | 2013181852 A | 9/2013 | |
| JP | 2018014210 A | 1/2018 | |
| KR | 100927541 B1 | 11/2009 | |
| KR | 20160011448 A | 2/2016 | |
| KR | 20160062468 A | 6/2016 | |
| KR | 20180031205 A | 3/2018 | |
| WO | 2018056448 A1 | 3/2018 | |

OTHER PUBLICATIONS

International Search Report for Application No. PCT/KR2020/002902 dated Jun. 17, 2020, 3 pgs.

\* cited by examiner

BATTERY STATE ESTIMATING APPARATUS

CROSS-REFERENCE TO RELATED APPLICATIONS

The present application is a national phase entry under 35 U.S.C. § 371 of International Application No. PCT/KR2020/002902 filed Feb. 28, 2020, published in Korean, which claims priority from Korean Patent Application No. 10-2019-0030710 filed Mar. 18, 2019, all of which are incorporated herein by reference.

TECHNICAL FIELD

The present disclosure relates to a battery state estimating apparatus, and more particularly, to a battery state estimating apparatus for determining whether degradation of a battery cell is accelerated and also determining the degree of degradation acceleration.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In recent years, as secondary batteries are applied to more fields, the secondary batteries are widely used not only in small-sized portable devices such as smartphones but also in medium-sized and large-sized devices such as electric vehicles including hybrid electric vehicles, and power storage devices.

The performance of the secondary battery degrades as the use period increases, compared to the initial stage. In addition, estimating the degree of performance degradation of the secondary battery is said to estimate the state of health (SOH) of the secondary battery, and the SOH of the secondary battery is an important factor in determining the replacement time of the secondary battery.

Conventionally, in Korean Publication KR 10-2016-0011448A, there has been proposed a device and method for measuring an open circuit voltage (OCV) of a battery, integrating a current flowing into the battery until the battery is fully charged, and calculating a full charge capacity charged to the battery by using the integrated current amount and the measured OCV.

However, KR 10-2016-0011448A just discloses a configuration that determines the degree of degradation on how much a battery has degraded ex post facto by measuring the loss of the full charge capacity of the battery, and does not provide any more specific information related to the degradation of the battery such as a present degradation rate of the battery. That is, KR 10-2016-0011448A just provides a battery degradation degree, which is information for determining a present or past state of the battery, and but does not provide any specific information, for example, for determining a battery state at a future point in time, such as a predicted deterioration rate or a predicted lifetime of the battery.

SUMMARY

Technical Problem

The present disclosure is designed to solve the problems of the related art, and therefore the present disclosure is directed to providing a battery state estimating apparatus, which may provide specific information about degradation of a battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery state estimating apparatus, comprising: a voltage measuring unit configured to measure a voltage of a battery cell and measure an open circuit voltage (OCV) of the battery cell whenever the measured voltage reaches a reference charge voltage; and a control unit configured to receive the OCV measured by the voltage measuring unit, calculate at least one of a voltage fluctuation rate or an electric resistance fluctuation rate based on a result obtained by processing the received OCV, determine at least one of: a voltage increase pattern or voltage decrease pattern based on the calculated voltage fluctuation rate and pre-stored voltage fluctuation rate data when the voltage fluctuation rate is calculated, or a resistance increase pattern or resistance decrease pattern based on the calculated electric resistance fluctuation rate and pre-stored electric resistance fluctuation rate data when the electric resistance fluctuation rate is calculated, and determine one or more degrees to which degradation of the battery cell is changing according to at least one of the determined voltage increase pattern, voltage decrease pattern resistance increase pattern or resistance decrease pattern.

When both the voltage increase pattern or voltage decrease pattern and the resistance increase pattern or resistance decrease pattern are determined, the control unit may be configured to determine a first degree to which degradation of the battery cell is changing based on the determined voltage increase pattern or voltage decrease pattern and determine a second degree to which degradation of the battery cell is changing based on the determined resistance increase or resistance decrease pattern, wherein the second determined degree is independent of the first determined degree.

The control unit may be configured to calculate the voltage fluctuation rate based on a comparison between the received OCV and a pre-stored reference voltage.

The pre-stored reference voltage may be an OCV of the battery cell when the voltage of the battery cell reaches the reference charge voltage during a predetermined cycle of the battery cell.

The pre-stored voltage fluctuation rate data may include a voltage fluctuation rate previously calculated by the control unit.

The control unit may be configured to calculate a plurality of voltage fluctuation rates during a present cycle of the battery cell and one or more previous cycles of the battery cell within a predetermined number of cycles from the present cycle of the battery cell among the pre-stored voltage fluctuation rate data; calculate a rate of voltage change between the calculated plurality of voltage fluctuation rates; and determine the voltage increase pattern or voltage decrease pattern based on the calculated rate of voltage change.

The control unit may be configured to determine the degree to which degradation of the battery cell is changing as a decelerated degradation in response to the voltage increase pattern being calculated based on the calculated voltage fluctuation rate and pre-stored voltage fluctuation rate data, and determine the degree to which degradation of the battery cell is changing as one of an accelerated degradation or an linear degradation in response to the voltage decrease pattern being calculated based on the calculated voltage fluctuation rate and pre-stored voltage fluctuation rate data.

The control unit may be configured to determine the degree to which degradation of the battery cell is changing to be a linear degradation in response to the calculated rate of voltage change being equal to or greater than a preset reference rate of voltage change, and determine the degree to which degradation of the battery cell is changing to be an accelerated degradation in response to the calculated rate of voltage change being less than a preset reference rate of voltage change.

The control unit may be configured to determine the voltage increase pattern or voltage decrease pattern only when the calculated voltage fluctuation rate being greater than a preset lower voltage limit and smaller than a preset upper voltage limit.

The control unit may be configured to calculate an internal resistance based on the received OCV and calculate the electric resistance fluctuation rate based on a comparison between the calculated internal resistance and a pre-stored reference resistance.

The pre-stored reference resistance may be calculated based on an OCV of the battery cell when the voltage of the battery cell reaches the reference charge voltage during a predetermined cycle of the battery cell.

The pre-stored electric resistance fluctuation rate data may include a electric resistance fluctuation rate previously calculated by the control unit.

The control unit may be configured to calculate a plurality of electric resistance fluctuation rates during a present cycle of the battery cell and one or more previous cycles of the battery cell within a predetermined number of cycles from the present cycle of the battery cell among the pre-stored electric resistance fluctuation rate data and calculate a rate of resistance change between the calculated plurality of electric resistance fluctuation rates and determine the resistance increase pattern or resistance decrease pattern based on the calculated rate of resistance change.

The control unit may be configured to determine the degree to which degradation of the battery cell is changing as one of an accelerated degradation or a linear degradation in response to the resistance increase pattern being calculated based on the calculated electric resistance fluctuation rate and pre-stored electric resistance fluctuation rate data and determine the degree to which degradation of the battery cell is changing as a decelerated degradation in response to the resistance decrease pattern being calculated based on the calculated electric resistance fluctuation rate and pre-stored electric resistance fluctuation rate data.

The control unit may be configured to determine the degree to which degradation of the battery cell is changing to be an accelerated degradation in response to the calculated rate of resistance change being equal to or greater than a preset reference rate of resistance change and determine the degree to which degradation of the battery cell is changing as a decelerated degradation in response to the resistance decrease pattern being calculated based on the calculated electric resistance fluctuation rate and pre-stored electric resistance fluctuation rate data.

The control unit may be configured to determine the resistance increase pattern or resistance decrease pattern only when the calculated electric resistance fluctuation rate is greater than a preset lower resistance limit.

A battery pack according to still another aspect of the present disclosure may comprise the battery state estimating apparatus according to any of the embodiments of the present disclosure.

An electric vehicle according to still another aspect of the present disclosure may comprise the battery state estimating apparatus according to any of the embodiments of the present disclosure.

Advantageous Effects

According to an aspect of the present disclosure, since not only the degradation degree of the battery cell but also the degradation acceleration degree of the battery cell is estimated, the present degradation state of the battery cell may be more accurately estimated, and the future degradation state of the battery cell may also be predicted more accurately.

In addition, according to one aspect of the present disclosure, since the degradation acceleration degree of the battery cell is classified into accelerated degradation, decelerated degradation and linear degradation and determined in detail, the degradation degree of the battery cell may be more specifically determined.

In addition, according to one aspect of the present disclosure, since the degradation acceleration degree of the battery cell is measured through various indexes, there is an advantage that the battery degradation degree may be more accurately determined or predicted.

In addition, according to one aspect of the present disclosure, since information about the degradation acceleration degree based on the OCV of the battery cell and the degradation acceleration degree based on the internal resistance is provided, respectively, the state information of the battery cell may be provided more specifically.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
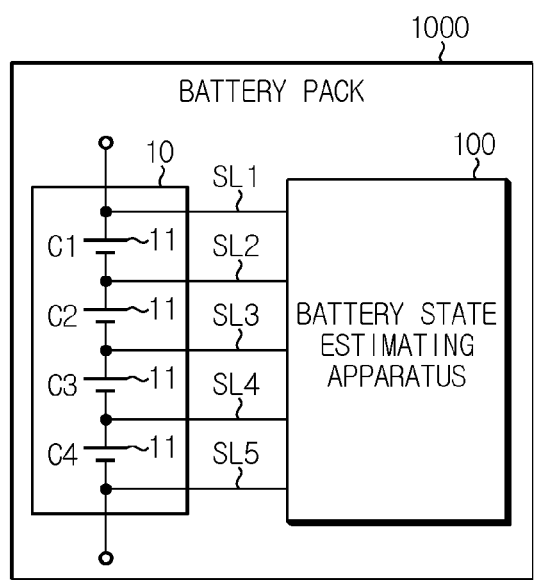
FIG. 1 is a diagram schematically showing a battery pack including a battery state estimating apparatus according to an embodiment of the present disclosure.

FIG. 1 is a diagram schematically showing a battery pack including a battery state estimating apparatus according to an embodiment of the present disclosure.

Referring to FIG. 1, a battery state estimating apparatus 100 according to an embodiment of the present disclosure may be electrically connected to a battery module 10 including a plurality of battery cells 11 to estimate the state of each of the plurality of battery cells 11. In addition, the battery state estimating apparatus 100 may be included in a battery pack 1000 together with the battery module 10. FIG. 1 shows an example in which one battery module 10 and one battery state estimating apparatus 100 are included in the battery pack 1000, but the number of battery modules 10 and battery state estimating apparatuses 100 included in the battery pack 1000 is not limited to the number shown in FIG. 1. Similarly, the number of battery cells 11 included in the battery module 10 is not limited to the number shown in FIG. 1.

Figure 2:
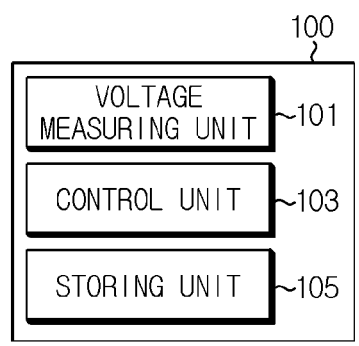
FIG. 2 is a block diagram schematically showing the battery state estimating apparatus according to an embodiment of the present disclosure.

The specific configuration of the battery state estimating apparatus 100 will be described with reference to FIG. 2. FIG. 2 is a block diagram schematically showing the battery state estimating apparatus according to an embodiment of the present disclosure.

Referring to FIG. 2, the battery state estimating apparatus 100 may include a voltage measuring unit 101 and a control unit 103.

The voltage measuring unit 101 may measure a voltage of the battery cell 11 included in the battery module 10. That is, the voltage measuring unit 101 may be configured to measure the voltage of each battery cell 11 included in the battery module 10. Preferably, the voltage measuring unit 101 may be configured to measure a charge voltage of the battery cell 11.

For example, in the embodiment shown in FIG. 1, the battery state estimating apparatus 100 may measure a voltage when a first battery cell C1, a second battery cell C2, a third battery cell C3 and a fourth battery cell C4 included in the battery module 10 are charged, respectively. Specifically, the voltage measuring unit 101 may measure the voltage of the first battery cell C1 through a first sensing line SL1 and a second sensing line SL2, and measure the voltage of the second battery cell C2 through the second sensing line SL2 and a third sensing line SL3. In addition, the voltage measuring unit 101 may measure the voltage of the third battery cell C3 through the third sensing line SL3 and a fourth sensing line SL4, and measure the voltage of the fourth battery cell C4 through the fourth sensing line SL4 and a fifth sensing line SL5.

The voltage measuring unit 101 may measure an open circuit voltage (OCV) of the battery cell 11. That is, the voltage measuring unit 101 may measure both the voltage and the OCV of the battery cell 11. In particular, the voltage measuring unit 101 may measure the OCV of each battery cell 11 whenever the measured voltage reaches a reference charge voltage. Here, the reference charge voltage may be a voltage that is preset and stored by a user or the like so that the voltage measuring unit 101 may measure the OCV by using the same. That is, the reference charge voltage is a reference value by which the OCV of the battery cell 11 may be measured by the voltage measuring unit 101, and may provide a time point when the voltage measuring unit 101 should measure the OCV of the battery cell 11. For example, the predetermined voltage can be set to 4.2 V. The voltage measuring unit 101 may measure voltages of the plurality of battery cells 11 and measure the OCVs of the battery cells 11 whenever the measured voltage of each battery cell 11 reaches the predetermined voltage.

For example, in the embodiment shown in FIG. 1, it is assumed that the reference charge voltage is set to V1 [V] for each battery cell 11. At this time, if the voltage of the first battery cell C1 reaches V1 [V] by charging, the voltage measuring unit 101 may measure the OCV of the first battery cell C1. Similarly, if the voltage of the second battery cell C2, the third battery cell C3 or the fourth battery cell C4 reaches V1 [V], the voltage measuring unit 101 may measure the OCV of the battery cell 11 whose voltage reaches V1 [V].

The control unit 103 may receive the OCV measured by the voltage measuring unit 101. The control unit 103 is configured to exchange electrical signals with the voltage measuring unit 101 inside the battery state estimating apparatus 100, and may receive the measured OCV from the voltage measuring unit 101.

The control unit 103 may calculate a voltage fluctuation rate and/or an electric resistance fluctuation rate based on the result obtained by processing the received OCV. That is, the control unit 103 may calculate a voltage fluctuation rate or an electric resistance fluctuation rate based on the received OCV, or both the voltage fluctuation rate and the electric resistance fluctuation rate.

For example, in the embodiment shown in FIG. 1, the control unit 103 may receive the OCV of the first battery cell C1 from the voltage measuring unit 101 and calculate at least one of the voltage fluctuation rate and the electric resistance fluctuation rate of the first battery cell C1 based on the received OCV of the first battery cell C1. Similarly, the control unit 103 may receive the OCV of each of the second battery cell C2, the third battery cell C3 and the fourth battery cell C4 from the voltage measuring unit 101 and calculate at least one of the voltage fluctuation rate and the electric resistance fluctuation rate of each of the second battery cell C2, the third battery cell C3 and the fourth battery cell C4.

If the voltage fluctuation rate is calculated, the control unit 103 may determine a voltage increase and decrease pattern based on the calculated voltage fluctuation rate and pre-stored voltage fluctuation rate data. Here, the voltage fluctuation rate data is reference data for comparison with the calculated voltage fluctuation rate, and may be stored in advance. The control unit 103 may update the pre-stored voltage fluctuation rate data by adding the calculated voltage fluctuation rate to the pre-stored voltage fluctuation rate data. In addition, the control unit 103 may determine the voltage increase and decrease pattern based on the updated voltage fluctuation rate data.

For example, the pre-stored voltage fluctuation rate data may be data in which a voltage fluctuation rate previously calculated by the control unit 103 is stored. In this case, the control unit 103 may determine the voltage increase and decrease pattern of the battery cell 11 based on all voltage fluctuation rates calculated from the cycle at which the reference voltage is calculated.

The voltage increase and decrease pattern may include various patterns such as a voltage increase pattern, a voltage decrease pattern and a voltage constant pattern. Hereinafter, for convenience of description, it will be described that the voltage increase and decrease pattern includes a voltage increase pattern and a voltage decrease pattern, and the voltage increase pattern includes patterns such as a voltage constant pattern excluding the voltage decrease pattern.

In addition, if the electric resistance fluctuation rate is calculated, the control unit 103 may determine a resistance increase and decrease pattern based on the calculated electric resistance fluctuation rate and pre-stored electric resistance fluctuation rate data. Here, the pre-stored electric resistance fluctuation rate data is reference data for comparison with the calculated electric resistance fluctuation rate, and may be stored in the storing unit 105 in advance. The control unit 103 may update the pre-stored electric resistance fluctuation rate data by adding the calculated electric resistance fluctuation rate to the pre-stored electric resistance fluctuation rate data. In addition, the control unit 103 may determine the resistance increase and decrease pattern based on the updated electric resistance fluctuation rate data.

For example, the pre-stored electric resistance fluctuation rate data may be data in which an electric resistance fluctuation rate calculated in the past by the control unit 103 is stored. In this case, the control unit 103 may determine the resistance increase and decrease pattern of the battery cell 11 based on all electric resistance fluctuation rates calculated from the predetermined cycle at which the reference resistance is calculated.

The resistance increase and decrease pattern may include various patterns such as a resistance increase pattern, a resistance decrease pattern and a resistance constant pattern. Hereinafter, for convenience of description, it will be assumed that the resistance increase and decrease pattern includes a resistance increase pattern and a resistance decrease pattern, and the resistance increase pattern includes patterns such as a constant resistance pattern excluding the resistance decrease pattern.

The control unit 103 may be configured to determine the degradation acceleration degree of the battery cell 11 according to at least one of the determined voltage increase and decrease pattern and the determined resistance increase and decrease pattern. That is, if the voltage increase and decrease pattern is determined, the control unit 103 may determine the degradation acceleration degree of the battery cell 11 according to the voltage increase and decrease pattern. In addition, if the resistance increase and decrease pattern is determined, the control unit 103 may determine the degradation acceleration degree of the battery cell 11 according to the resistance increase and decrease pattern. Here, the degradation acceleration degree may be information indicating whether the degradation of the battery cell 11 is getting faster or slower.

For example, the control unit 103 may determine the voltage increase and decrease pattern of the first battery cell C1, and determine the degradation acceleration degree of the first battery cell C1 according to the determined voltage increase and decrease pattern. In addition, the control unit 103 may determine the resistance increase and decrease pattern of the first battery cell C1, and determine the degradation acceleration degree of the first battery cell C1 according to the determined resistance increase and decrease pattern.

The battery state estimating apparatus 100 according to an embodiment of the present disclosure may determine the rate at which the present battery cell 11 is degraded by synthesizing the previous history thereof, rather than determining only the degradation degree based on the present state of the battery cell 11. Accordingly, the battery state estimating apparatus 100 according to an embodiment of the present disclosure may provide information capable of estimating the state of the battery cell 11 at a future time point, thereby helping to predict the life of the battery cell 11 or determine a future state.

In addition, the battery state estimating apparatus 100 according to an embodiment of the present disclosure has an advantage of providing more specific state information for the battery cell 11 by providing both the degradation acceleration degree according to the voltage increase and decrease pattern of the battery cell 11 and the degradation acceleration degree according to the resistance increase and decrease pattern of the battery cell 11, when the battery cell 11 is in a charge situation.

In particular, the control unit 103 may independently determine the degradation acceleration degree for each battery cell 11. For example, the control unit 103 may determine at least one of the voltage increase and decrease pattern and the resistance increase and decrease pattern separately for the first battery cell C1, the second battery cell C2, the third battery cell C3 and the fourth battery cell C4, respectively. In addition, the control unit 103 may separately determine the degradation acceleration degree for each of the first battery cell C1, the second battery cell C2, the third battery cell C3 and the fourth battery cell C4 according to the determined voltage increase and decrease pattern. Also, the control unit 103 may also separately determine the degradation acceleration degree for each of the first battery cell C1, the second battery cell C2, the third battery cell C3 and the fourth battery cell C4 according to the determined resistance increase and decrease pattern.

That is, since the battery state estimating apparatus 100 according to an embodiment of the present disclosure may independently determine the degradation acceleration degree of each battery cell 11, it is possible to determine the degradation degree and the degradation acceleration degree of each battery cell 11, also predict the life of each battery cell 11. Specifically, the battery state estimating apparatus 100 may calculate the degradation degree of each battery cell 11 by measuring the OCV of each battery cell 11 to calculate a loss capacity, and also may determine the degradation acceleration degree about how quickly each battery cell 11 is degraded. Accordingly, the battery state estimating apparatus 100 may estimate the future degradation degree of each battery cell 11 according to the degradation acceleration degree of the battery cell 11, and may also adjust the control condition of each battery cell 11 according to the estimated degradation degree.

For example, even battery cells 11 of the same product line may not have exactly the same available capacity due to problems such as initial resistance variation or capacity variation. For example, it is assumed that the battery cells have a factory setting capacity of 1000 mAh, but the first battery cell C1 has an initial capacity of 900 mAh, and the second battery cell C2 has an initial capacity of 1000 mAh. If the present available capacities of the first battery cell C1 and the second battery cell C2 become equal to 800 mAh due to the use during the same period, even though the first battery cell C1 and the second battery cell C2 have the same available capacity, it is not accurate estimation of the state of the battery cell 11 to determine that both battery cells 11 have the same degradation degree due to the difference in initial capacity. In addition, even though the degradation degree of the first battery cell C1 is calculated as about 11% and the degradation degree of the second battery cell C2 is calculated as 20%, the calculated degradation degree is only meaningful as an index indicating only a present state of each of the first battery cell C1 and the second battery cell C2 according to the present capacity compared to the initial capacity, and is not suitable as an index for predicting a present degradation acceleration degree of each of the first battery cell C1 and the second battery cell C2 or a future situation such as an expected lifetime according to the degradation acceleration degree. That is, the ratio of the present capacity to the initial capacity of the battery cell 11 is only an index for ex post determination of the deterioration degree of the battery cell 11, and it is not suitable as an index for determining the degradation acceleration degree, the future deterioration rate, or the expected lifespan of the battery cell 11.

Meanwhile, the battery state estimating apparatus 100 according to an embodiment of the present disclosure may accurately determine a present state of the battery cell 11 by determining the degradation acceleration degree of the battery cell 11. In addition, after determining the degradation acceleration degree of the battery cell 11, the battery state estimating apparatus 100 may take an action to change the control condition for the battery cell 11 so that the life of the battery cell 11 lasts longer.

Here, the control unit 103 may optionally include a processor, an application-specific integrated circuit (ASIC), another chipset, a logic circuit, a register, a communication modem, a data processing device, and the like, known in the art to execute various control logics performed in the battery state estimating apparatus 100 according to an embodiment of the present disclosure. In addition, when the control logic is implemented in software, the control unit 103 may be implemented as a set of program modules. At this time, the program module may be stored in a memory and executed by the processor. The memory may be provided in or out of the processor, and may be connected to the processor by various well-known means. For example, the control unit 103 is a processor provided in the battery state estimating apparatus 100 according to an embodiment of the present disclosure, and may provide the determined degradation acceleration degree of the battery cell 11 to a user through an output device such as a display device. In addition, the control unit 103 may provide a notification for replacement or warning of the battery cell 11 to the user through an external notification device based on the degradation acceleration degree of the battery cell 11.

In addition, referring to FIG. 2, the battery state estimating apparatus 100 according to an embodiment of the present disclosure may further include a storing unit 105. The storing unit 105 may store the voltage fluctuation rate data and the electric resistance fluctuation rate data. That is, in the storing unit 105, voltage fluctuation rate data and electric resistance fluctuation rate data calculated by the control unit 103 in the past may be stored. The control unit 103 may determine the voltage increase and decrease pattern of the battery cell 11 based on the voltage fluctuation rate data pre-stored in the storing unit 105. In addition, the control unit 103 may determine the resistance increase and decrease pattern of the battery cell 11 based on the electric resistance fluctuation rate data pre-stored in the storing unit 105.

That is, the storing unit 105 may store data or programs required for each component of the battery state estimating apparatus 100 according to an embodiment of the present disclosure to operate and perform, such as previous voltage fluctuation rate data and previous electric resistance fluctuation rate data calculated by the control unit 103. The storing unit 105 is not particularly limited in its kind as long as it is a known information storage means that may record, erase, update and read data. As an example, the information storage means may include a random-access memory (RAM), a flash memory, a read-only memory ROM, an electrically erasable programmable read-only memory (EEPROM), a register, and the like. The storing unit 105 may store program codes in which processes executable by the control unit 103 are defined.

If both the voltage increase and decrease pattern and the resistance increase and decrease pattern are determined, the control unit 103 may determine the first degradation acceleration degree of the battery cell 11 based on the determined voltage increase and decrease pattern. For example, in the embodiment shown in FIG. 1, the control unit 103 may determine the voltage increase and decrease pattern of the first battery cell C1, and determine the first degradation acceleration degree of the first battery cell C1 based on the determined voltage increase and decrease pattern. In addition, the control unit 103 may be configured to determine the second degradation acceleration degree of the battery cell 11, which is independent of the first degradation acceleration degree, based on the determined resistance increase and decrease pattern. In the former example, the control unit 103 may determine the resistance increase and decrease pattern of the first battery cell C1 independently from the first degradation acceleration degree of the first battery cell C1, and determine the second degradation acceleration degree of the first battery cell C1 based on the determined resistance increase and decrease pattern. That is, if both the voltage increase and decrease pattern and the resistance increase and decrease pattern of the first battery cell C1 are determined, the control unit 103 may calculate the first degradation acceleration degree and the second degradation acceleration degree of the first battery cell C1, independent from each other.

Specifically, when the battery cell 11 is in a discharge situation, OCV may affect a change factor of resistance. For example, when the battery cell 11 is discharged, the increase and decrease of the OCV affects the increase and decrease of resistance, so that the increase and decrease of the OCV and the increase and decrease of resistance may appear inversely. That is, in the discharge situation, the degradation acceleration degree of the battery cell 11 should be determined in consideration of the specificity that the OCV affects the resistance change factor of the battery cell 11. However, in the charge situation, the increase and decrease of the OCV of the battery cell 11 and the increase and decrease of the resistance are independent factors not affecting each other, and thus the control unit 103 may determine the first degradation acceleration degree based on the voltage increase and decrease pattern and determine the second degradation acceleration degree based on the resistance increase and decrease pattern independently of the first degradation acceleration degree.

The battery state estimating apparatus 100 according to an embodiment of the present disclosure may determine both the degradation acceleration degree based on the voltage increase and decrease pattern and the degradation acceleration degree based on the resistance increase and decrease pattern in consideration of the specificity of the charge situation in which OCV and resistance do not affect each other. Therefore, since the battery state estimating apparatus 100 according to an embodiment of the present disclosure provides various information about the state of the battery cell 11, it is possible to help in determining the state of the battery cell 11.

In the above, it has been described that the control unit 103 may determine the degradation acceleration degree of the battery cell 11 based on each of the voltage increase and decrease pattern and the resistance increase and decrease pattern, when the battery cell 11 is in a charge situation. Hereinafter, the process of determining the first degradation acceleration degree based on the voltage increase and decrease pattern and determining the second degradation acceleration degree based on the resistance increase and decrease pattern will be described in detail.

First, the process of determining the first degradation acceleration degree based on the voltage increase and decrease pattern will be described. The control unit 103 may calculate a voltage fluctuation rate by comparing the received OCV with a pre-stored reference voltage. Here, the pre-stored reference voltage is a reference value for comparison with the OCV measured by the voltage measuring unit 101, and may be a value stored in the storing unit 105 in advance. That is, the reference voltage may be pre-stored in the storing unit 105, and the control unit 103 may calculate the voltage fluctuation rate by comparing the reference voltage pre-stored in the storing unit 105 with the OCV received from the voltage measuring unit 101.

For example, the pre-stored reference voltage may include an OCV of the battery cell 11 measured at a predetermined cycle time point. The voltage fluctuation rate may be obtained by comparing the pre-stored reference voltage with the OCV received from the voltage measuring unit 101 by the control unit 103. In particular, the voltage fluctuation rate may be calculated as a ratio or difference of the pre-stored reference voltage and the measured value of OCV. That is, the control unit 103 may receive the OCV measured at a cycle after the predetermined cycle time point from the voltage measuring unit 101, and calculate the ratio of the received OCV to the pre-stored reference voltage as a voltage fluctuation rate.

For example, it is assumed that the reference voltage pre-stored for the first battery cell C1 is A1 [V]. In addition, it is assumed that the OCV of the first battery cell C1 measured at a first time point by the voltage measuring unit 101 is B1 [V]. The control unit 103 may calculate the voltage fluctuation rate of the first battery cell C1 at the first time point as the difference between A1 and B1. For example, the voltage fluctuation rate of the first battery cell C1 at the first time point may be calculated using the calculation formula of B1−A1. As another example, the voltage fluctuation rate of the first battery cell C1 at the first time point may also be calculated using the calculation formula of "(B1÷A1)×100". Hereinafter, for convenience of description, it will be described that the voltage fluctuation rate is calculated using the calculation formula of B1−A1.

Preferably, the pre-stored reference voltage may include an OCV when the battery cell 11 is charged at a predetermined cycle so that the voltage of the battery cell 11 reaches the reference charge voltage. Here, the predetermined cycle may be a time point within a predetermined number of cycles from BOL (Beginning Of Life), and, for example, may be a first charge time point after shipment of the battery cell 11.

For example, it is assumed that the reference charge voltage is set as 4.2 V. In this case, the voltage measuring unit 101 may measure a voltage in an initial charge process (an initial state) of the first battery cell C1, and measure an OCV when the measured voltage reaches 4.2 V.

Preferably, the pre-stored voltage fluctuation rate data may be configured to include a voltage fluctuation rate calculated by the control unit 103 whenever OCV is measured by the voltage measuring unit 101. That is, from the predetermined cycle to the present time point, the voltage measuring unit 101 may measure OCV when the voltage of the battery cell 11 reaches the reference charge voltage by charging, and the control unit 103 may calculate a voltage fluctuation rate according to the OCV measured by the voltage measuring unit 101. In addition, the calculated voltage fluctuation rate may be included in the voltage fluctuation rate data pre-stored in the storing unit 105.

For example, in the embodiment shown in FIG. 1, the pre-stored voltage fluctuation rate data for the first battery cell C1 may include voltage fluctuation rates of the first battery cell C1 calculated from a first time point to an $N-1^{th}$ time point. Here, N is an integer of 2 or more, and when N is 2, the pre-stored voltage fluctuation rate data may include only the voltage fluctuation rate of the first battery cell C1 calculated at the first time point. If the voltage fluctuation rate of the first battery cell C1 is calculated at the $N^{th}$ time point by the control unit 103, the voltage fluctuation rate of the first battery cell C1 at the $N^{th}$ time point may be included in the voltage fluctuation rate data pre-stored in the storing unit 105. In this case, the voltage fluctuation rate data pre-stored in the storing unit 105 may include first to $N^{th}$ voltage fluctuation rates.

The battery state estimating apparatus 100 according to an embodiment of the present disclosure may determine a present voltage increase and decrease pattern of the battery cell 11 based on the voltage fluctuation rate data pre-stored in the storing unit 105 from the past time point to the present time point. That is, since the battery state estimating apparatus 100 according to an embodiment of the present disclosure determines the present voltage increase and decrease pattern and the present degradation acceleration degree of the battery cell 11 based on the pre-stored voltage fluctuation rate data in which the calculated voltage fluctuation rates are accumulatively stored, there is an advantage in that the degradation acceleration degree and the degradation degree of the battery cell 11 may be more accurately determined, compared to the case where the degradation degree of the battery cell 11 is determined only by the voltage fluctuation rate at a specific time point. In addition, since the determined degradation acceleration degree and the determined degradation degree may be utilized as information for estimating a future state of the battery cell 11, the battery state estimating apparatus 100 according to an embodiment of the present disclosure has an advantage of providing information capable of estimating a future state based on not only the past and present states but also the degradation acceleration degree of the battery cell 11.

The control unit 103 may calculate a rate of voltage change of a plurality of voltage fluctuation rates included within a predetermined number of cycles from the present cycle of the battery cell 11 among the pre-stored voltage fluctuation rate data. Here, the rate of voltage change may include an average rate of change or an instantaneous rate of change of the voltage fluctuation rates. In addition, the plurality of voltage fluctuation rates included within a predetermined number of cycles from the present cycle may include a plurality of voltage fluctuation rates included within a preset number of cycles from the present cycle. For example, the control unit 103 may calculate a rate of voltage change of a plurality of voltage fluctuation rates included within 50 cycles from the present cycle. The calculation of the rate of voltage change will be described in detail with reference to FIGS. 3 and 4.

Figure 3:
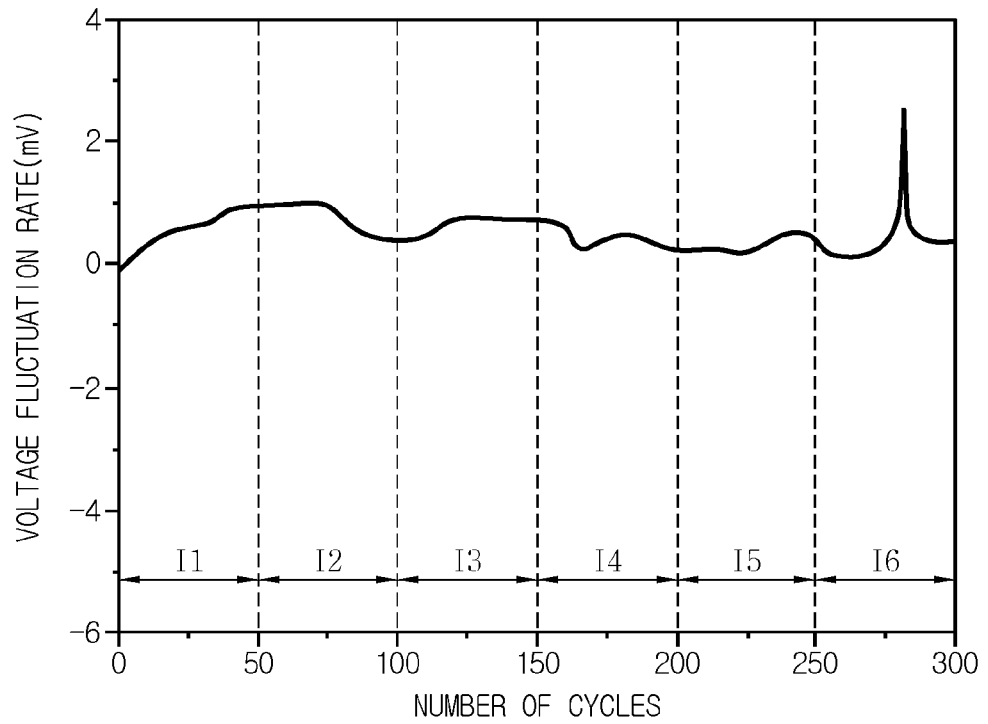
FIG. 3 is a diagram showing a voltage fluctuation rate of a first battery cell, calculated by the battery state estimating apparatus according to an embodiment of the present disclosure.
Figure 4:
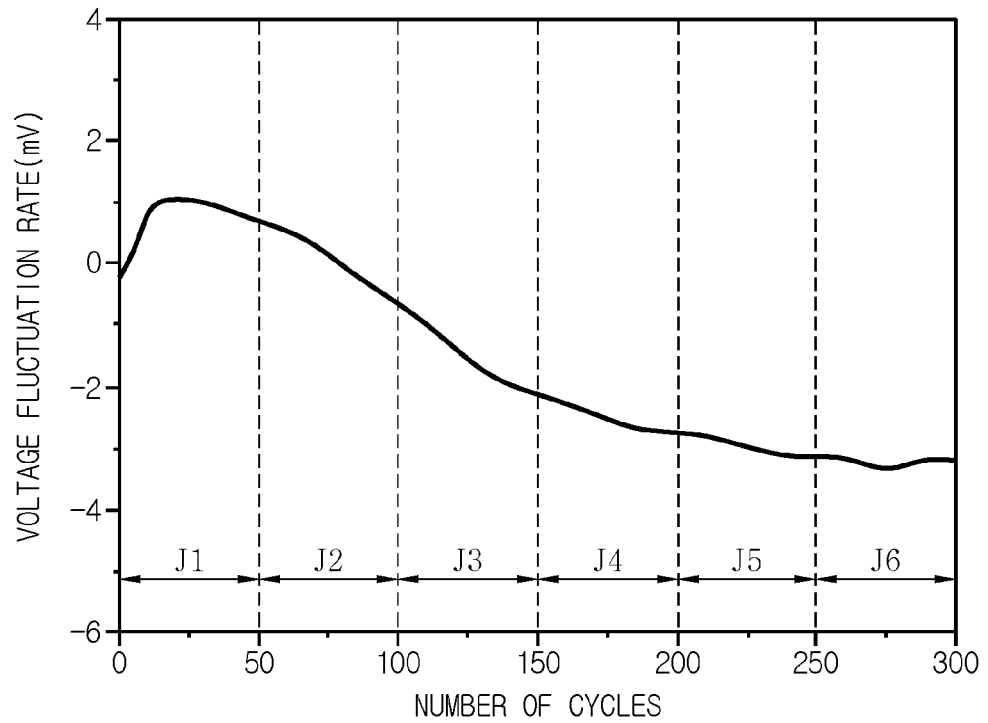
FIG. 4 is a diagram showing a voltage fluctuation rate of a second battery cell, calculated by the battery state estimating apparatus according to an embodiment of the present disclosure.

FIG. 3 is a diagram showing a voltage fluctuation rate of the first battery cell, calculated by the battery state estimating apparatus 100 according to an embodiment of the present disclosure. FIG. 4 is a diagram showing a voltage fluctuation rate of the second battery cell, calculated by the battery state estimating apparatus 100 according to an embodiment of the present disclosure. Referring to FIGS. 3 and 4, the storing unit 105 may store voltage fluctuation rate data pre-stored for the first battery cell C1 and voltage fluctuation rate data pre-stored for the second battery cell C2 at every cycle. Hereinafter, as shown in FIG. 3, a region including a preset number of cycles for the first battery cell C1 will be described as an In region. Similarly, as shown in FIG. 4, a region including a preset number of cycles for the second battery cell C2 will be described as a Jn region. Here, n is a positive integer. For example, if the preset number of cycles is 50, an I1 region may include 0 to 50 cycles of the first battery cell C1, and an I2 region may include 51 to 100 cycles of the first battery cell C1. For convenience of description, it is assumed that 0 cycle of the first battery cell C1 is included in the I1 region, and 0 cycle of the second battery cell C2 is included in the J1 region.

For example, it is assumed that a preset number of cycles to be included in one region is 50. In FIG. 3, if the present cycle of the first battery cell C1 is 300 cycle, the control unit 103 may extract a voltage fluctuation rate of each cycle belonging to an I6 region including 251 to 300 cycles of the voltage fluctuation rate data pre-stored in the storing unit 105 for the first battery cell C1. That is, the control unit 103 may calculate a rate of voltage change of the I6 region by comparing the voltage fluctuation rate of every cycle belonging to the I6 region of the first battery cell C1 with each other. Similarly, in FIG. 4, if the present cycle of the second battery cell C2 is 150 cycle, the control unit 103 may extract a voltage fluctuation rate of every cycle belonging to the J3 region including 101 to 150 cycles of the voltage fluctuation rate data pre-stored in the storing unit 105 for the second battery cell C2. The control unit 103 may calculate a rate of voltage change of the J3 region by comparing the voltage fluctuation rate of every cycle belonging to the J3 region of the second battery cell C2 with each other. Here, the rate of voltage change means a specific value for the rate of change.

Hereinafter, for convenience of description, it will be assumed that the rate of voltage change is a positive change rate if it is equal to or greater than 0 and the rate of voltage change is a negative change rate if it is smaller than 0. In addition, an example in which the control unit 103 calculates a rate of voltage change will be described in detail with reference to FIG. 5.

Figure 5:
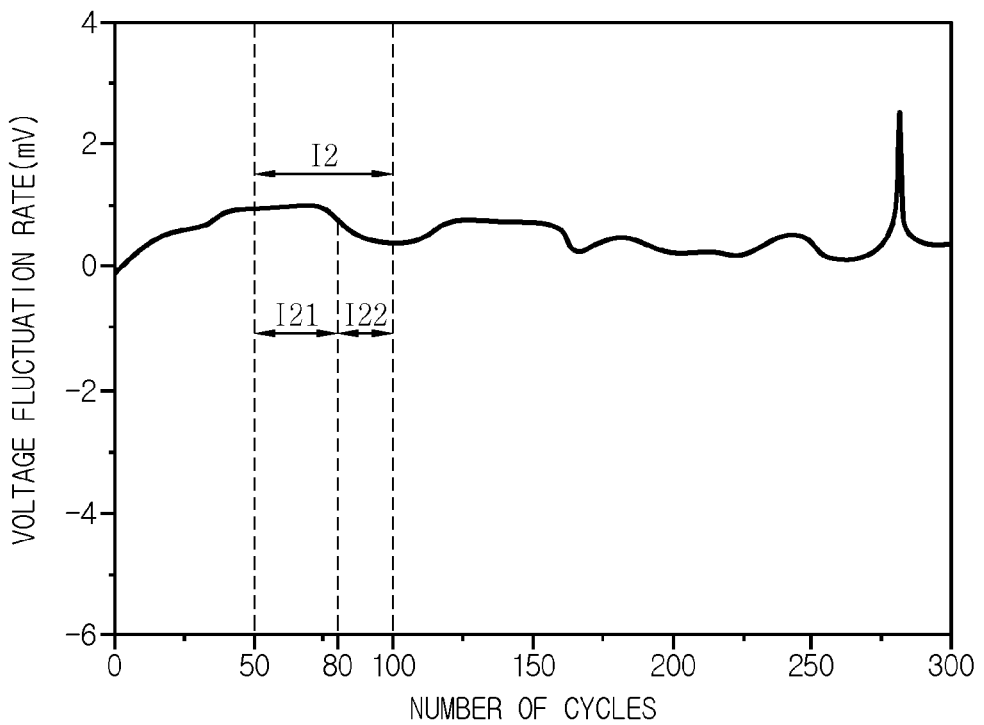
FIG. 5 is an enlarged view showing a region of the voltage fluctuation rate of the first battery cell, calculated by the battery state estimating apparatus according to an embodiment of the present disclosure.

FIG. 5 is an enlarged view showing a region of the voltage fluctuation rate of the first battery cell, calculated by the battery state estimating apparatus according to an embodiment of the present disclosure. That is, FIG. 5 is an enlarged view showing a voltage fluctuation rate included in the J2 region among voltage fluctuation rates calculated for the first battery cell C1.

Referring to the embodiment of FIG. 5, the control unit 103 may calculate a rate of voltage change of a voltage fluctuation rate included in a region to which the present cycle of the battery cell 11 belongs. At this time, the control unit 103 may divide the region to which the present cycle of the battery cell 11 belongs into a plurality of sub regions based on the rate of voltage change of the region to which the present cycle of the battery cell 11 belongs. Specifically, the control unit 103 may divide a single region into a plurality of sub regions based on a cycle at which the rate of voltage change calculated in one region changes from a positive change rate to a negative change rate or from a negative change rate to a positive change rate. For example, in the embodiment of FIG. 5, the control unit 103 may calculate an average rate of change for successive cycles included in the I2 region or an instantaneous rate of change for successive cycles included in the I2 region. Specifically, based on 80 cycle, the rate of voltage change of the I21 region may be calculated as a positive change rate, and the rate of voltage change of the I22 region may be calculated as a negative change rate. Accordingly, the control unit 103 may divide the I2 region of the first battery cell C1 into the I21 region and the I22 region based on 80 cycle.

That is, in the embodiment of FIG. 5, the control unit 103 may divide the I2 region into the I21 and I22 regions and calculate the rate of voltage change for each of the I21 region and the I22 region. As such, the control unit 103 may divide one region into sub regions and calculate a rate of voltage change for each sub region.

Figure 6:
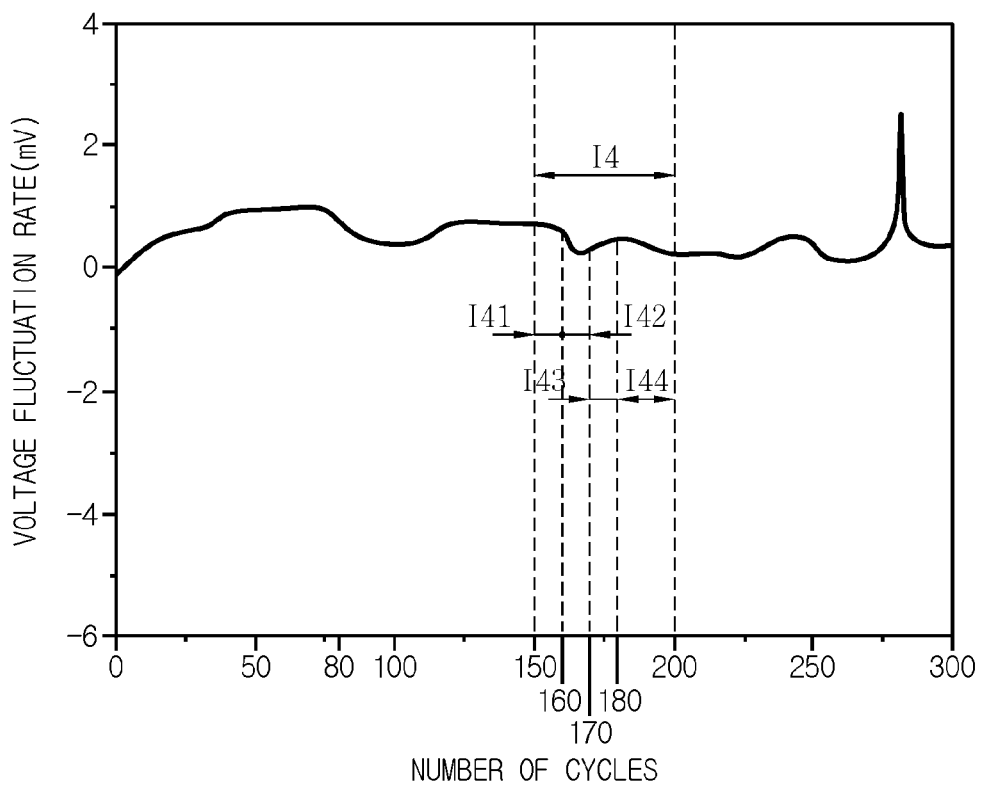
FIG. 6 is an enlarged view showing another region of the voltage fluctuation rate of the first battery cell, calculated by the battery state estimating apparatus according to an embodiment of the present disclosure.
Figure 7:
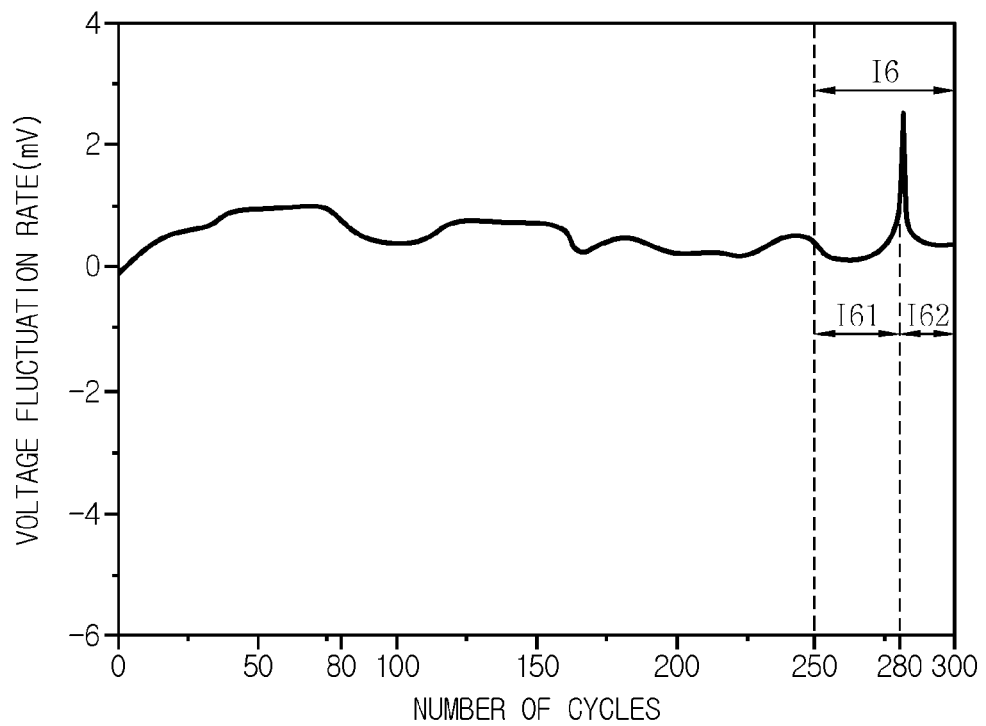
FIG. 7 is an enlarged view showing still another region of the voltage fluctuation rate of the first battery cell, calculated by the battery state estimating apparatus according to an embodiment of the present disclosure.

FIG. 6 is an enlarged view showing another region of the voltage fluctuation rate of the first battery cell, calculated by the battery state estimating apparatus according to an embodiment of the present disclosure. FIG. 7 is an enlarged view showing still another region of the voltage fluctuation rate of the first battery cell, calculated by the battery state estimating apparatus according to an embodiment of the present disclosure.

Referring to FIGS. 6 and 7, the control unit 103 may divide the I4 region and the I6 region into a plurality of sub regions according to the calculated rate of voltage change. That is, the control unit 103 may divide the I4 region into I41, I42, I43 and I44 sub regions and divide the I6 region into I61 and I62 sub regions.

Figure 8:
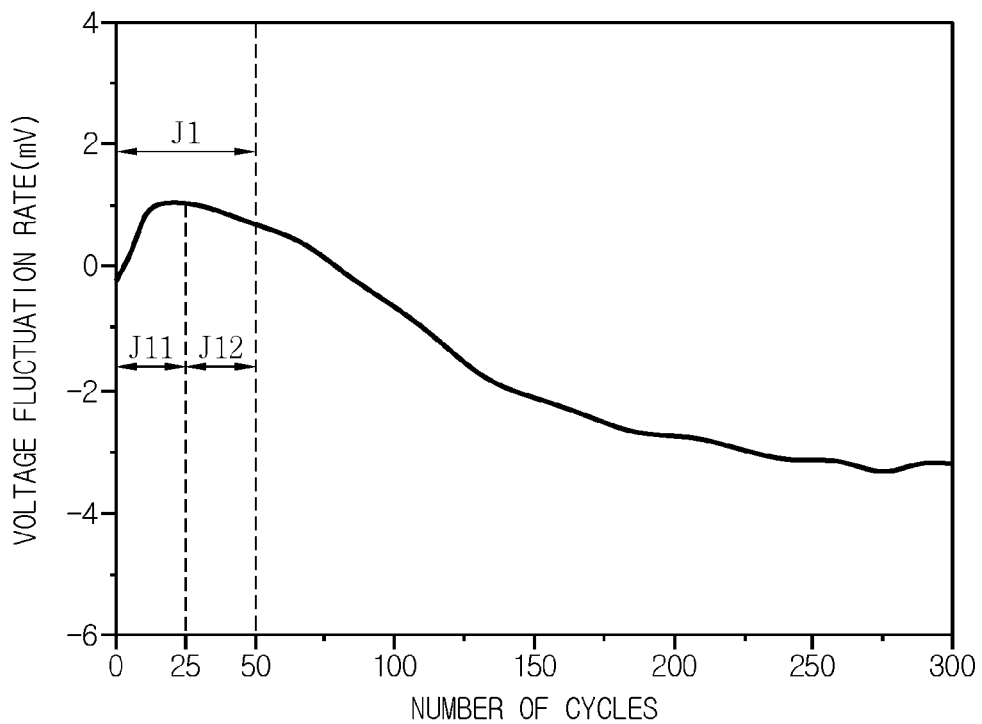
FIG. 8 is an enlarged view showing a region of the voltage fluctuation rate of the second battery cell, calculated by the battery state estimating apparatus according to an embodiment of the present disclosure.

FIG. 8 is an enlarged view showing a region of the voltage fluctuation rate of the second battery cell, calculated by the battery state estimating apparatus according to an embodiment of the present disclosure.

Referring to FIG. 8, the control unit 103 may divide the J1 region into a plurality of sub regions according to the rate of voltage change calculated for the second battery cell C2. That is, the control unit 103 may divide the J1 region into J11 and J12 sub regions.

When calculating a rate of change between voltage fluctuation rates included in a region to which the present cycle of the battery cell 11 belongs, the control unit 103 may not calculate the rate of change by determining the region to which the present cycle belongs as just a single region. In addition, the control unit 103 may determine a cycle time point at which the rate of voltage change changes from a positive change rate to a negative change rate or from a negative change rate to a positive change rate, and divide the region to which the present cycle of the battery cell 11 belongs into sub regions based on the determined cycle time point.

As described above, the battery state estimating apparatus 100 according to an embodiment of the present disclosure does not determine that the region to which the present cycle of the battery cell 11 belongs is only one region indiscriminately, and if necessary, the battery state estimating apparatus 100 may divide the region into sub regions and calculate a rate of voltage change in more detail. Therefore, there is an advantage in that the present state of the battery cell 11 may be more accurately determined.

In addition, the control unit 103 may determine a voltage increase and decrease pattern based on the calculated rate of voltage change. Here, the voltage increase and decrease pattern may include a voltage increase pattern and a voltage decrease pattern. In particular, the control unit 103 may determine the voltage increase and decrease pattern for the case where the calculated rate of change is a positive change rate as a voltage increase pattern. In addition, the control unit 103 may determine the voltage increase and decrease pattern when the calculated rate of change is a negative change rate as a voltage decrease pattern.

For example, referring to FIGS. 3 and 5, if the present cycle of the first battery cell C1 belongs to the I1 region, the control unit 103 may calculate the rate of voltage change of the first battery cell C1 based on the voltage fluctuation rate included in the I1 region. In this case, the control unit 103 may calculate the rate of voltage change of the I1 region as a value equal to or greater than zero. That is, the rate of voltage change of the I1 region may be calculated as a positive change rate. In addition, the control unit 103 may determine the present voltage increase and decrease pattern of the first battery cell C1 as a voltage increase pattern based on the result that the rate of voltage change is calculated as a positive change rate. In addition, if the present cycle of the first battery cell C1 belongs to the I22 region of the I2 region, the control unit 103 may calculate a negative change rate based on the voltage fluctuation rate included in the corresponding region. Also, the control unit 103 may determine the present voltage increase and decrease pattern of the first battery cell C1 as a voltage decrease pattern based on the calculated negative change rate.

For example, referring to FIGS. 4 and 8, if the present cycle of the second battery cell C2 belongs to the J1 region, the control unit 103 may calculate the rate of voltage change based on the voltage fluctuation rate included in the J1 region. At this time, if the present cycle of the second battery cell C2 belongs to the J11 region, the control unit 103 may calculate the rate of voltage change of the second battery cell C2 as a value of 0 or above, and determine the voltage increase and decrease pattern as a voltage increase pattern. Conversely, when if the present cycle of the second battery cell C2 belongs to the J12 region, the control unit 103 may calculate the rate of voltage change of the second battery cell C2 as a value less than 0, and determine the voltage increase and decrease pattern as a voltage decrease pattern.

In addition, if the present cycle of the second battery cell C2 belongs to any one of the J2 to J6 regions, the control unit 103 may calculate the rate of voltage change of the second battery cell C2 as a negative change rate, and determine the present voltage increase and decrease pattern of the second battery cell C2 as a voltage decrease pattern based on the calculated negative change rate.

That is, the battery state estimating apparatus 100 according to an embodiment of the present disclosure has an advantage of more accurately estimating a present state of the battery cell 11 in consideration of not only the present state of the battery cell 11 but also the previous state thereof. In addition, since the battery state estimating apparatus 100 according to an embodiment of the present disclosure calculates the rate of voltage change of the battery cell 11 and determines the voltage increase and decrease pattern based on the rate of voltage change, it has an advantage of providing information from which a future state of the battery cell 11 may be easily estimated. In addition, even within a predetermined number of cycles from the present cycle, the voltage increase and decrease pattern of the battery cell 11 may be determined more specifically and more concretely by dividing the region in which the rate of voltage change varies from negative to positive or from positive to negative into sub regions. Therefore, it is possible to more accurately estimate the present state of the battery cell 11.

The control unit 103 may determine the first degradation acceleration degree of the battery cell 11 according to the voltage increase and decrease pattern of the battery cell 11 as any one of accelerated degradation, linear degradation and decelerated degradation. Here, the accelerated degradation refers to a state in which the degradation of the battery cell 11 is gradually accelerated, and the linear degradation refers to a state in which the degradation of the battery cell 11 is not gradually accelerated like the accelerated degradation but is performed linearly. Conversely, the decelerated degradation refers to a state in which the degradation of the battery cell 11 is performed gradually slowly. Hereinafter, the process of determining the first degradation acceleration degree according to the voltage increase and decrease pattern will be described.

The control unit 103 may be configured to determine the first degradation acceleration degree of the battery cell 11 as decelerated degradation, if the voltage increase and decrease pattern is determined as the voltage increase pattern.

For example, referring to FIG. 3 as in the previous example, if the present cycle of the first battery cell C1 belongs to the I1 region, the control unit 103 may determine the voltage increase and decrease pattern of the first battery cell C1 as the voltage increase pattern. The control unit 103 may determine the present first degradation acceleration degree of the first battery cell C1 as decelerated degradation. That is, if the voltage increase and decrease pattern of the battery cell 11 is determined as the voltage increase pattern, the control unit 103 may determine the degradation acceleration degree of the battery cell 11 only as decelerated degradation.

As in the previous example, referring to FIG. 4, if the present cycle of the second battery cell C2 belongs to the J2 region, the control unit 103 may determine the voltage increase and decrease pattern of the second battery cell C2 as the voltage decrease pattern. The control unit 103 may determine the first degradation acceleration degree of the second battery cell C2 as any one of accelerated degradation and linear degradation according to the rate of voltage change of the J2 region determined as the voltage decrease pattern.

That is, if the voltage increase and decrease pattern is determined as the voltage decrease pattern, the control unit 103 may determine the first degradation acceleration degree as accelerated degradation or linear degradation based on the rate of voltage change of the battery cell 11. Conversely, if the voltage increase and decrease pattern is determined as the voltage increase pattern, the control unit 103 may be configured to omit the process of calculating the rate of voltage change of the battery cell 11 and determine the first degradation acceleration degree only as decelerated degradation.

Since the battery state estimating apparatus 100 according to an embodiment of the present disclosure determines the first degradation acceleration degree of the battery cell 11 in detail as the accelerated degradation, the linear degradation or the decelerated degradation according to the voltage increase and decrease pattern and the rate of voltage change of the battery cell 11, there is an advantage of accurately determining and diagnosing the present state of the battery cell 11.

In addition, if the voltage increase and decrease pattern is determined as the voltage increase pattern, the battery state estimating apparatus 100 may not separately calculate a rate of voltage change. That is, the battery state estimating apparatus 100 determines the degradation acceleration degree of the battery cell 11 as decelerated degradation only when the voltage increase and decrease pattern of the battery cell 11 is determined as the voltage increase pattern, and this has an advantage of saving time required to determine the degradation acceleration degree of the battery cell 11.

Among the degradation acceleration degrees of the battery cell 11, the accelerated degradation and the linear degradation may be distinguished according to how fast the battery cell 11 is degraded. Hereinafter, the criteria for distinguishing the accelerated degradation and the linear degradation will be described.

The control unit 103 may be configured to determine the degradation acceleration degree of the battery cell 11 as linear degradation, if the calculated rate of voltage change is greater than or equal to the preset reference rate of voltage change.

Conversely, if the calculated rate of voltage change is less than the preset reference rate of voltage change, the control unit 103 may be configured to determine the degradation acceleration degree of the battery cell 11 as accelerated degradation.

Here, the preset reference rate of voltage change is a reference change rate for determining the degradation acceleration degree as accelerated degradation or linear degradation, if the voltage increase and decrease pattern of the battery cell 11 is determined as a voltage decrease pattern.

For example, the preset reference rate of voltage change may be preset as the voltage fluctuation rate decreases by 1 mV at every 50 cycles. In the embodiment shown in FIGS. 5, 6 and 7, if the present cycle of the first battery cell C1 belongs to any one of the I22, I42, I44 and I62 regions, the control unit 103 may compare the rate of voltage change of the region to which the present cycle of the first battery cell C1 belongs with the preset reference rate of voltage change.

The control unit 103 may determine as linear degradation if the rate of voltage change of the region to which the present cycle of the first battery cell C1 belongs is greater than or equal to the preset reference rate of voltage change, and determine as accelerated degradation if the rate of voltage change of the region to which the present cycle of the first battery cell C1 belongs is less than the preset reference rate of voltage change.

Similarly, in the embodiment shown in FIGS. 4 and 8, if the present cycle of the second battery cell C2 belongs to any one of the J12, J2, J3, J4, J5 and J6 regions, the control unit 103 may compare the rate of voltage change of the region to which the present cycle of the second battery cell C2 belongs with the preset reference rate of voltage change. Preferably, referring to FIGS. 4 and 8, if the present cycle of the second battery cell C2 belongs to any one of J12, J2 to J6 region, the control unit 103 may compare the rate of voltage change of the region to which the present cycle of the second battery cell C2 belongs with the preset reference rate of voltage change.

Here, the control unit 103 may divide the J1 region into the J11 region and the J12 region based on the rate of voltage change of the J1 region. In the process of calculating the rate of voltage change of the J1 region, the control unit 103 may divide the J1 region into the J11 region and the J12 region based on the point where the voltage increase and decrease pattern changes. Here, since the voltage increase and decrease pattern of the J11 region is a voltage increase pattern and the voltage increase and decrease pattern of the J12 region is a voltage decrease pattern, the control unit 103 may divide the J1 region into the J11 and J12 regions based on 25 cycles. That is, the J11 region and the J12 region may be sub regions of the J1 region.

For example, if the present cycle of the second battery cell C2 belongs to the J11 region, the control unit 103 may determine the voltage increase and decrease pattern of the second battery cell C2 as a voltage increase pattern based on the rate of voltage change of the region to which the present cycle of the second battery cell C2 belongs. In addition, the control unit 103 may determine the first degradation acceleration degree of the second battery cell C2 as decelerated degradation.

As another example, it is assumed that the rate of voltage change of the J12, J2 and J3 regions is less than the preset rate of voltage change and the rate of voltage change of the J4, J5 and J6 regions is equal to or greater than the preset rate of voltage change. If the present cycle of the second battery cell C2 belongs to any one of the J12, J2 and J3 regions, the control unit 103 may determine the first degradation acceleration degree of the second battery cell C2 as accelerated degradation. Conversely, if the present cycle of the second battery cell C2 belongs to any one of the J4, J5 and J6 region, the control unit 103 may determine the first degradation acceleration degree of the second battery cell C2 as linear degradation.

That is, the battery state estimating apparatus 100 according to an embodiment of the present disclosure may compare the preset reference rate of voltage change with the rate of voltage change of the region to which the present cycle of the battery cell 11 belongs. In addition, the battery state estimating apparatus 100 may determine the degradation acceleration degree of the battery cell 11 by subdividing the same into the accelerated degradation or the linear degradation, without indiscriminately determining the degradation acceleration degree for the voltage increase pattern. Therefore, the present state of the battery cell 11 may be further subdivided and specifically diagnosed.

The control unit 103 may be configured to determine the voltage increase and decrease pattern of the battery cell 11 only when the voltage fluctuation rate calculated for the battery cell 11 is greater than a preset lower voltage limit and smaller than a preset upper voltage limit. That is, the control unit 103 may determine the voltage increase and decrease pattern only when the voltage fluctuation rate of the battery cell 11 is within a certain range.

For example, if the voltage fluctuation rate of the battery cell 11 is greater than or equal to the preset upper limit, this is the case where the OCV of the battery cell 11 increases to a reference value or above, at which the battery cell 11 may abnormally degrades and have a sudden drop risk. In addition, if the voltage fluctuation rate of the battery cell 11 is smaller than or equal to the preset lower limit, this is the case where the OCV of the battery cell 11 decreases to a reference value or below due to an electric short circuit or the like and the battery cell 11 may be abnormally degraded.

Therefore, the control unit 103 may determine the voltage increase and decrease pattern for the case where the battery cell 11 is normally degraded, except for the case where the battery cell 11 is degraded abnormally.

If the normal or abnormal state of the battery cell 11 is not distinguished in advance, the degradation acceleration degree may be determined according to the voltage increase and decrease pattern in an abnormal state, and the battery control condition may be adjusted according to the determined degradation acceleration degree, which may further deteriorate the state of the battery cell 11.

Accordingly, since the battery state estimating apparatus 100 according to an embodiment of the present disclosure first divides the state of the battery cell 11 into a normal state or an abnormal state and then determines the voltage increase and decrease pattern and the degradation acceleration degree only when the state of the battery cell 11 is a normal state, it is possible to shorten the time required to determine the degradation acceleration degree of the battery cell 11 and to improve the accuracy of determining the state of the battery cell 11.

In the above, it has been described that the control unit 103 determines the first degradation acceleration degree of the battery cell 11 based on the voltage increase and decrease pattern, when the battery cell 11 is in a charge situation. Hereinafter, the process of determining the second degradation acceleration degree based on the resistance increase and decrease pattern will be described in detail.

Here, the second degradation acceleration degree is the degradation acceleration degree determined according to the resistance increase and decrease pattern of the battery cell 11, and may be determined as any one of accelerated degradation, linear degradation and decelerated degradation, similar to the first degradation acceleration degree described above.

First, the control unit 103 may calculate an internal resistance of the battery cell 11 based on the OCV of the battery cell 11 measured by the voltage measuring unit 101.

For example, the control unit 103 may calculate the present resistance of the battery cell 11 according to the calculation formula of "$(|CCV_{EoC} - OCV_{EoC}|) \div i_{t1}$". Here, $CCV_{EoC}$ may refer to a charge or discharge voltage of the battery cell 11 measured after a time point t1 from the time point where the $OCV_{EoC}$ of the battery cell 11 is measured, $OCV_{EoC}$ may refer to the OCV of the battery cell 11 measured when the voltage of the battery cell 11 reaches the reference charge voltage in a charge situation, and $i_{t1}$ may refer to an amount of charge or discharge current that has flowed for the time t1.

In addition, the control unit 103 may be configured to calculate an electric resistance fluctuation rate by comparing the calculated internal resistance with a pre-stored reference resistance. Here, the pre-stored reference resistance is a reference value to be compared with the present resistance of the battery cell 11 calculated by the control unit 103, and may be a value stored in the storing unit 105 in advance.

Preferably, the pre-stored reference resistance may be a resistance of the battery cell 11 measured at a predetermined cycle. The control unit 103 may calculate the electric resistance fluctuation rate as a ratio or a difference of the resistance of the present battery cell 11 to the pre-stored reference resistance.

For example, for the first battery cell C1 shown in FIG. 1, it is assumed that the pre-stored reference resistance is A2 [Ω]. Also, it is assumed that the present resistance of the first battery cell C1 calculated by the control unit 103 is B2 [Ω] based on the OCV of the first battery cell C1 measured by the voltage measuring unit 101 at the first time point. The control unit 103 may calculate the electric resistance fluctuation rate of the first battery cell C1 at the first time point as the ratio of B2 [Ω] to A2 [Ω]. For example, the electric resistance fluctuation rate of the first battery cell C1 at the first time point may be calculated using the calculation formula of "(B2÷A2)×100".

Preferably, the pre-stored reference resistance may include a reference resistance calculated based on the reference voltage pre-stored in the storing unit 105. That is, the pre-stored reference resistance corresponds to the pre-stored reference voltage, and may be a resistance calculated based on the OCV when the battery cell 11 is charged at a predetermined cycle so that the voltage of the battery cell 11 reaches the reference charge voltage. The pre-stored reference resistance may be stored in the storing unit 105.

For example, in the storing unit 105, a reference voltage A1 [V] may be pre-stored, and a reference resistance A2 [Ω] calculated based on the reference voltage A1 may be pre-stored.

Preferably, the pre-stored electric resistance fluctuation rate data may be configured to include electric resistance fluctuation rates calculated by the control unit 103 whenever OCV is measured by the voltage measuring unit 101. That is, from the predetermined cycle before the present cycle, the voltage measuring unit 101 may measure the OCV when the voltage of the battery cell 11 reaches the reference charge voltage by charging. In addition, the control unit 103 may calculate the present resistance based on the OCV measured by the voltage measuring unit 101, and calculate the electric resistance fluctuation rate of the battery cell 11 according to the calculated present resistance and the reference resistance pre-stored in the storing unit 105. Further, the calculated electric resistance fluctuation rate may be included in the resistance fluctuation rate data pre-stored in the storing unit 105.

For example, in the embodiment shown in FIG. 1, the electric resistance fluctuation rate data pre-stored for the first battery cell C1 may include electric resistance fluctuation rates of the first battery cell C1 calculated from the first time point to the N−1$^{th}$ time point. Here, N is an integer of 2 or more, and when N is 2, the pre-stored electric resistance fluctuation rate data may include only the electric resistance fluctuation rate of the first battery cell C1 calculated at the first time point. If the electric resistance fluctuation rate of the first battery cell C1 is calculated at the N$^{th}$ time point by the control unit 103, the electric resistance fluctuation rate of the first battery cell C1 calculated at the N$^{th}$ time point may be included the electric resistance fluctuation rate data pre-stored in the storing unit 105. In this case, the electric resistance fluctuation rate data pre-stored in the storing unit 105 may include first to N$^{th}$ electric resistance fluctuation rates.

The battery state estimating apparatus 100 according to an embodiment of the present disclosure may determine the present resistance increase and decrease pattern of the battery cell 11 based on the electric resistance fluctuation rate data pre-stored in the storing unit 105 from the past time point to the present time point. That is, the battery state estimating apparatus 100 according to an embodiment of the present disclosure may determine the present resistance increase and decrease pattern of the battery cell 11 based on the pre-stored electric resistance fluctuation rate data in which electric resistance fluctuation rates calculated in the past are accumulatively stored. In addition, since the battery state estimating apparatus 100 determines the present degradation acceleration degree of the battery cell 11 based on the determined resistance increase and decrease pattern and the determined voltage increase and decrease pattern, the degradation acceleration degree or the degradation degree of the battery cell 11 may be more accurately determined, compared to the case where the degradation degree of the battery cell 11 is determined only by the electric resistance fluctuation rate at a specific time point.

Also, since the determined degradation acceleration degree may be utilized as information for estimating a future state of the battery cell 11, the battery state estimating apparatus 100 according to an embodiment of the present disclosure has an advantage of providing information capable of estimating a future state based on the degradation acceleration degree as well as past and present states of the battery cell 11.

The control unit 103 may calculate a rate of resistance change of a plurality of electric resistance fluctuation rates included within a predetermined number of cycles from the present cycle of the battery cell 11 among the pre-stored electric resistance fluctuation rate data. Here, the rate of resistance change may include an average rate of change or an instantaneous rate of change of the electric resistance fluctuation rates. In addition, the plurality of electric resistance fluctuation rates included within a predetermined number of cycles from the present cycle may include a plurality of electric resistance fluctuation rates included within a preset number of cycles from the present cycle.

For example, the control unit 103 may calculate a rate of resistance change of a plurality of electric resistance fluctuation rates included within 50 cycles from the present cycle. The calculation of the rate of resistance change will be described in detail with reference to FIGS. 9 and 10.

Figure 9:
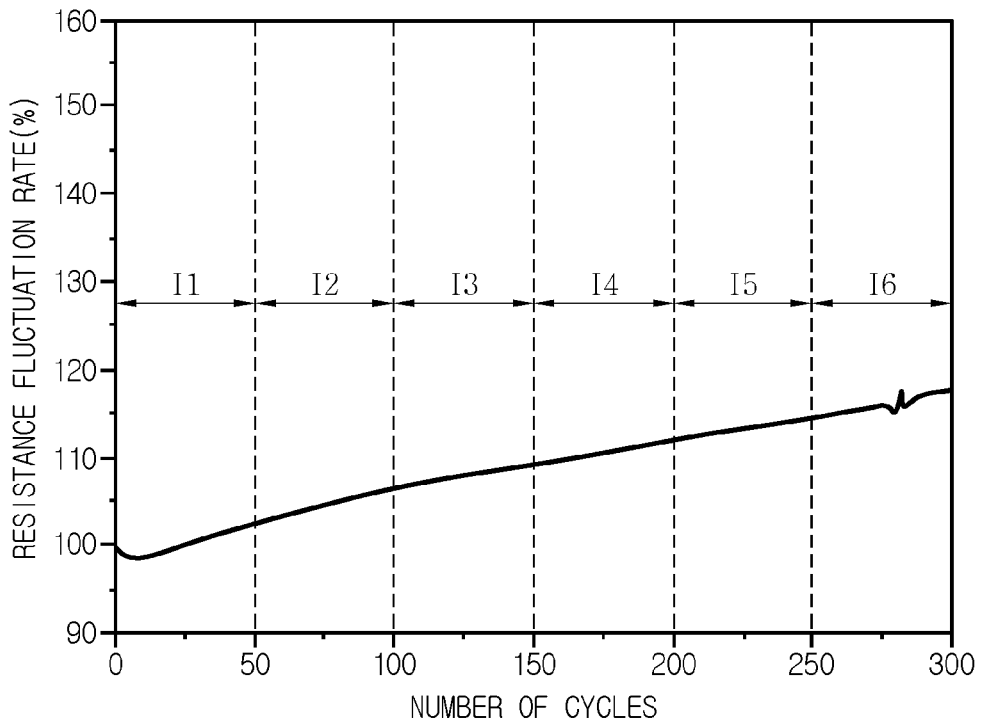
FIG. 9 is a diagram showing an electric resistance fluctuation rate of the first battery cell, calculated by the battery state estimating apparatus according to an embodiment of the present disclosure.
Figure 10:
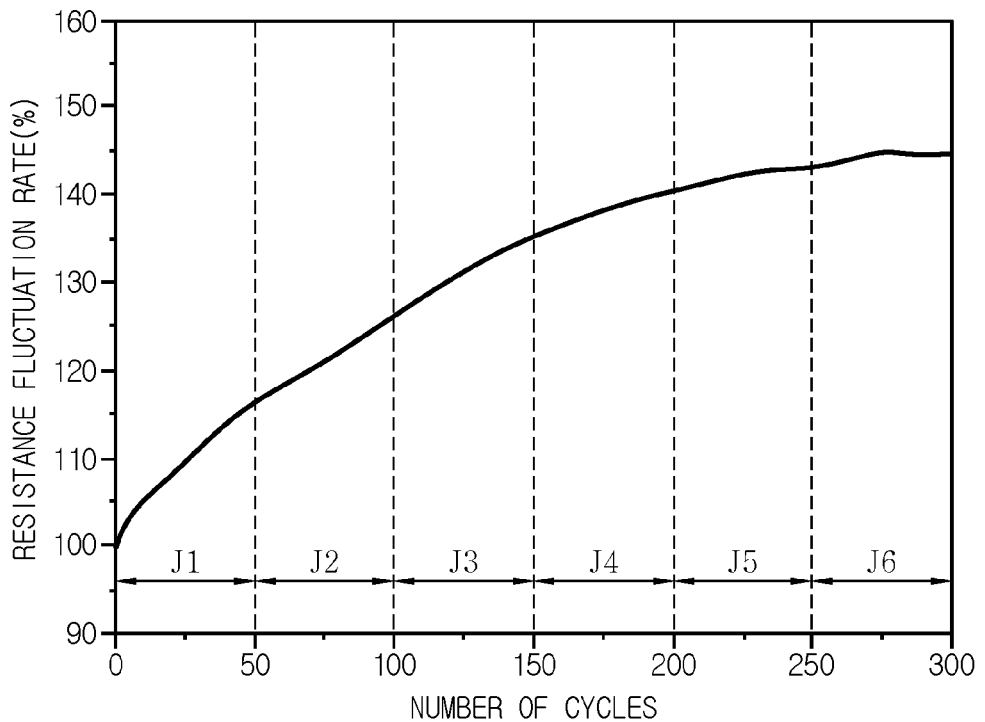
FIG. 10 is a diagram showing an electric resistance fluctuation rate of the second battery cell, calculated by the battery state estimating apparatus according to an embodiment of the present disclosure.

FIG. 9 is a diagram showing an electric resistance fluctuation rate of the first battery cell, calculated by the battery state estimating apparatus according to an embodiment of the present disclosure. FIG. 10 is a diagram showing an electric resistance fluctuation rate of the second battery cell, calculated by the battery state estimating apparatus according to an embodiment of the present disclosure.

Referring to FIGS. 9 and 10, the storing unit 105 may store electric resistance fluctuation rate data pre-stored for the first battery cell C1 and electric resistance fluctuation rate data pre-stored for the second battery cell C2 at every cycle, respectively.

Hereinafter, as shown in FIG. 9, a region including a preset number of cycles for the first battery cell C1 is described as an In region. Similarly, as shown in FIG. 10, a region including a preset number of cycles for the second battery cell C2 is described as a Jn region. Here, the In region shown in FIG. 9 may correspond to the In region shown in FIG. 3, and the Jn region shown in FIG. 10 may correspond to the Jn region shown in FIG. 4.

For example, it is assumed that the number of cycles preset to be included in one region is 50. In FIG. 9, if the present cycle of the first battery cell C1 is 300 cycle, the control unit 103 may extract an electric resistance fluctuation rate of each cycle belonging to the I6 region including 251 to 300 cycles of the electric resistance fluctuation rate data pre-stored in the storing unit 105 for the first battery cell C1. That is, the control unit 103 may calculate the rate of resistance change of the I6 region by comparing the electric resistance fluctuation rates of the cycles belonging to the I6 region of the first battery cell C1 with each other.

Similarly, in FIG. 10, if the present cycle of the second battery cell C2 is 150 cycle, the control unit 103 may extract electric resistance fluctuation rates belonging to the J3 region including 101 to 150 cycles among the electric resistance fluctuation rate data pre-stored in the storing unit 105 for the second battery cell C2. The control unit 103 may calculate the rate of resistance change of the J3 region by comparing the electric resistance fluctuation rates of the cycles belonging to the J3 region of the second battery cell C2 with each other. Here, the rate of resistance change refers to a specific value for the rate of change.

Hereinafter, for convenience of description, it will be assumed that the rate of resistance change is a positive change rate when it is 0 or more and the rate of resistance change is a negative change rate when it is less than 0.

Similar to the example of calculating the rate of voltage change described with reference to FIGS. 5 to 8, when calculating the rate of resistance change of the electric resistance fluctuation rates included in the region to which the present cycle of the battery cell 11 belongs, the control unit 103 may not calculate the rate of resistance change by determining that the present cycle belongs to only one region. In addition, the control unit 103 may determine a cycle at which the rate of resistance change changes from positive to negative or from negative to positive, and divide the region to which the present cycle of the battery cell 11 belongs into sub regions based on the determined cycle. That is, the control unit 103 may divide a single region into a plurality of sub regions according to the rate of resistance change of the electric resistance fluctuation rates belonging to the single region and calculate a rate of resistance change for each of the divided sub regions.

Figure 11:
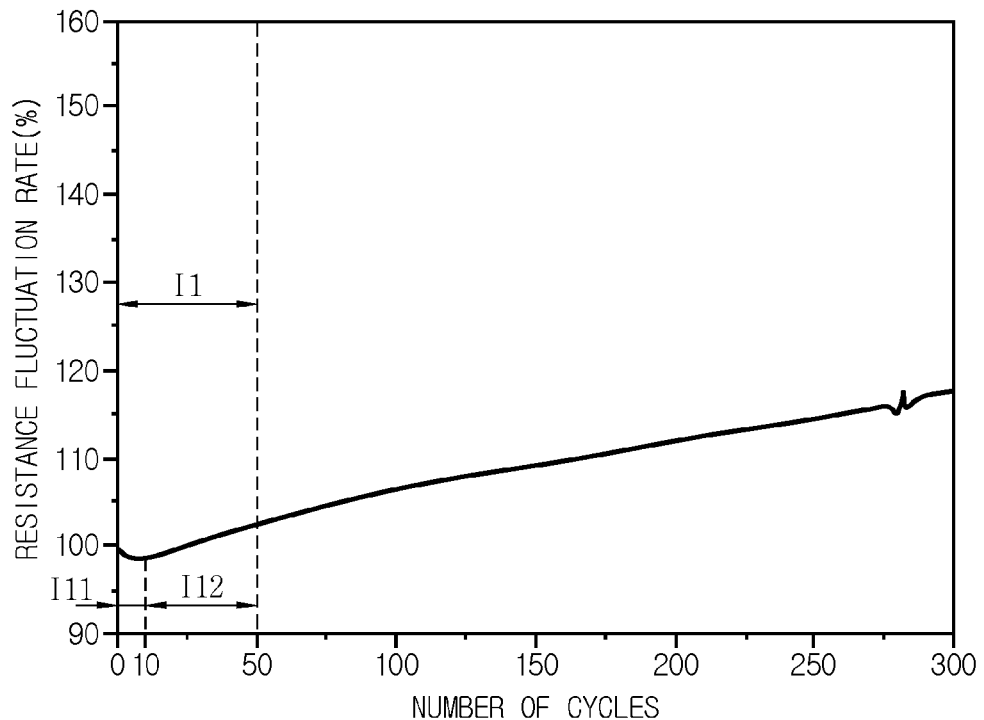
FIG. 11 is an enlarged view showing a region of the electric resistance fluctuation rate of the first battery cell, calculated by the battery state estimating apparatus according to an embodiment of the present disclosure.

FIG. 11 is an enlarged view showing a region of the electric resistance fluctuation rate of the first battery cell, calculated by the battery state estimating apparatus according to an embodiment of the present disclosure.

For example, in the example of FIG. 11, the control unit 103 may calculate an average rate of change for consecutive cycles included in the I1 region or an instantaneous rate of change for continuous cycles included in the I1 region. Specifically, based on 10 cycle, the rate of resistance change of the I11 region may be calculated as a negative change rate, and the rate of resistance change of the I12 region may be calculated as a positive change rate. Accordingly, the control unit 103 may divide the I1 region of the first battery cell C2 into an I11 region and an I12 region based on 10 cycle.

That is, in the embodiment of FIG. 11, the control unit 103 may divide the I1 region into the I11 and I12 regions and calculate a rate of resistance change for each of the I11 region and the I12 region. As such, the control unit 103 may divide one region into sub regions and calculate a rate of resistance change for each sub region.

As described above, since the battery state estimating apparatus 100 according to an embodiment of the present disclosure does not determine that the region to which the present cycle of the battery cell 11 belongs is only one region indiscriminately, and if necessary, the battery state estimating apparatus 100 divides the region into sub regions and calculates a rate of resistance change in more detail, and thus there is an advantage in that the present state of the battery cell 11 may be more accurately determined.

In addition, the control unit 103 may determine a resistance increase and decrease pattern based on the calculated rate of resistance change. Here, the resistance increase and decrease pattern may include a resistance increase pattern and a resistance decrease pattern. In particular, the control unit 103 may determine the resistance increase and decrease pattern as a resistance increase pattern when the calculated rate of resistance change is a positive change rate. In addition, the control unit 103 may determine the resistance increase and decrease pattern as a resistance decrease pattern when the calculated rate of resistance change is a negative change rate.

For example, referring to FIGS. 9 and 11, if the present cycle of the first battery cell C1 belongs to the I1 region, the control unit 103 may calculate the rate of resistance change of the first battery cell C1 based on the electric resistance fluctuation rate included in the I1 region. If the present cycle of the first battery cell C1 belongs to the I11 region, the control unit 103 may calculate the rate of resistance change of the I11 region as a value less than 0 (zero). That is, the rate of resistance change of the I11 region may be calculated as a negative change rate. In addition, the control unit 103 may determine the present resistance increase and decrease pattern of the first battery cell C1 as a resistance decrease pattern based on the result that the rate of resistance change is calculated as a negative change rate.

Conversely, if the present cycle of the first battery cell C1 belongs to the I12 region, the control unit 103 may calculate the rate of resistance change of the I12 region as 0 or above. Namely, the rate of resistance change of the I12 region may be calculated as a positive change rate. The control unit 103 may determine the present resistance increase and decrease pattern of the first battery cell C1 as the resistance increase pattern based on the result that the rate of resistance change is calculated as the positive change rate. Similarly, even when the present cycle of the first battery cell C1 belongs to any one of the I2 to I6 regions, the control unit 103 may calculate the rate of resistance change as a positive change rate based on the electric resistance fluctuation rate included in the region. In addition, the control unit 103 may determine the present resistance increase and decrease pattern of the first battery cell C1 as the resistance increase pattern based on the result calculated as the positive change rate.

As another example, referring to FIG. 10, if the present cycle of the second battery cell C2 belongs to any one of the J1 to J6 regions, the control unit 103 may calculate the rate of resistance change of the region to which the present cycle of the second battery cell C2 belongs. The control unit 103 may calculate the rate of resistance change of the region to which the present cycle of the second battery cell C2 belongs as 0 or above. That is, the rate of resistance change of the region to which the present cycle of the second battery cell C2 belongs may be calculated as a positive change rate. In addition, the control unit 103 may determine the present resistance increase and decrease pattern of the second battery cell C2 as a resistance increase pattern based on the calculated rate of resistance change.

That is, since the battery state estimating apparatus 100 according to an embodiment of the present disclosure determines the present resistance increase and decrease pattern of the battery cell 11 according to the calculated electric resistance fluctuation rate of the present cycle and the previous rate of resistance change stored in the pre-stored electric resistance fluctuation rate data, there is an advantage that the state of the battery cell 11 may be estimated by considering not only the present state of the battery cell 11 but also the previous state thereof.

In addition, since the battery state estimating apparatus 100 according to an embodiment of the present disclosure calculates the rate of resistance change of the battery cell 11 and determines the resistance increase and decrease pattern based on the calculated rate of resistance change, there is an advantage of providing information that allows to easily estimate a future state of the battery cell 11.

If the resistance increase and decrease pattern is determined as the resistance increase pattern, the control unit 103 may be configured to determine the degradation acceleration degree of the battery cell 11 as any one of accelerated degradation and linear degradation according to the calculated rate of resistance change. That is, if the resistance increase and decrease pattern is determined as the resistance increase pattern, the control unit 103 may determine the second degradation acceleration degree as any one of accelerated degradation and linear degradation.

In addition, if the resistance increase and decrease pattern is determined as the resistance decrease pattern, the control unit 103 may be configured to determine the degradation acceleration degree of the battery cell 11 as decelerated degradation. That is, if the resistance increase and decrease pattern is determined as the resistance decrease pattern, the control unit 103 may determine the second degradation acceleration degree only as decelerated degradation.

For example, in the embodiment of FIGS. 9 and 11, if the present cycle of the first battery cell C1 belongs to the I11 region, the control unit 103 may determine the resistance increase and decrease pattern of the first battery cell C1 as the resistance decrease pattern. In addition, the control unit 103 may determine the second degradation acceleration degree of the first battery cell C1 as decelerated degradation.

Conversely, if the present cycle of the first battery cell C1 belongs to any one of the I12 to I6 region, the control unit 103 may determine the resistance increase and decrease pattern of the first battery cell C1 as the resistance increase pattern. In addition, the control unit 103 may determine the second degradation acceleration degree of the first battery cell C1 as any one of accelerated degradation and linear degradation according to the rate of resistance change of the region to which the first battery cell C1 belongs.

As another example, in the embodiment of FIG. 10, if the present cycle of the second battery cell C2 belongs to any one of the J1 to J6 regions, the control unit 103 may determine the resistance increase and decrease pattern of the second battery cell C2 as the resistance increase pattern. In addition, the control unit 103 may determine the second degradation acceleration degree of the second battery cell C2 as any one of accelerated degradation and linear degradation according to the rate of resistance change of the region to which the second battery cell C2 belongs.

That is, since the change factor of resistance caused by OCV is not considered in a state where the battery cell 11 is in a charge situation, unlike the discharge situation, the voltage increase and decrease pattern of the battery cell 11 may not be considered when determining the second degradation acceleration degree based on the resistance increase and decrease pattern of the battery cell 11.

Therefore, since the degradation acceleration degree of the battery cell 11 is determined based on the difference between the charge situation and the discharge situation, the battery state estimating apparatus 100 according to an embodiment of the present disclosure has the advantage of determining specific state information about the degradation acceleration degree and the degradation degree of the battery cell 11 and providing the determined state information.

As described above, among the degradation acceleration degrees of the battery cell 11, the accelerated degradation and the linear degradation may be classified according to how fast the battery cell 11 is degraded. The control unit 103 may be configured to determine the degradation acceleration degree of the battery cell 11 as accelerated degradation if the resistance increase and decrease pattern of the battery cell 11 is a resistance increase pattern and the calculated rate of resistance change is greater than or equal to a preset reference rate of resistance change.

In addition, the control unit 103 may be configured to determine the degradation acceleration degree of the battery cell 11 as linear degradation if the resistance increase and decrease pattern is a resistance increase pattern and the calculated rate of resistance change is smaller than the preset reference rate of resistance change.

Here, the preset reference rate of resistance change is a reference change rate for determining the degradation acceleration degree as any one of accelerated degradation and linear degradation when the resistance increase and decrease pattern of the battery cell 11 is determined as a resistance increase pattern. For example, the preset reference rate of resistance change may be preset such that the electric resistance fluctuation rate increases by 10% at every 100 cycles.

For example, in the embodiment of FIGS. 9 and 11, it is assumed that the present cycle of the first battery cell C1 belongs to any one of the I12 to I6 regions, and the rate of resistance change of the I12 to I6 regions is smaller than the preset reference rate of resistance change. Since the rate of resistance change of the I12 to I6 regions is smaller than the preset reference rate of resistance change, the control unit 103 may determine the second degradation acceleration degree of the first battery cell C1 as linear degradation.

As another example, in the embodiment of FIG. 10, it is assumed that the rate of resistance change of the J1 to J3 regions is greater than or equal to the preset reference rate of resistance change, and the rate of resistance change of the J4 to J6 regions is smaller than the preset reference rate of resistance change. If the present cycle of the second battery cell C2 belongs to any one of the J1 to J3 regions, the control unit 103 may compare the rate of resistance change of the region to which the present cycle of the second battery cell C2 belongs with the preset reference rate of resistance change, and determine the second degradation acceleration degree of the second battery cell C2 as accelerated degradation. Conversely, if the present cycle of the second battery cell C2 belongs to any of the J4 to J6 regions, the control unit 103 may compare the rate of resistance change of the region to which the present cycle of the second battery cell C2 belongs with the preset reference rate of resistance change, and determine the second degradation acceleration degree of the second battery cell C2 as linear degradation.

That is, the battery state estimating apparatus 100 according to an embodiment of the present disclosure may compare the preset reference rate of resistance change with the rate of resistance change and determine the degradation acceleration degree by subdividing the same into any one of the accelerated degradation and the linear degradation, without indiscriminately determining the degradation acceleration degree for the resistance increase pattern. Therefore, the present state of the battery cell 11 may be further subdivided and specifically diagnosed.

The control unit 103 may be configured to determine the resistance increase and decrease pattern of the battery cell 11 only when the calculated electric resistance fluctuation rate exceeds a preset lower resistance limit. That is, the control unit 103 may determine the resistance increase and decrease pattern only when the electric resistance fluctuation rate of the battery cell 11 exceeds the preset lower resistance limit, and determine the second degradation acceleration degree of the battery cell 11 according to the determined resistance increase and decrease pattern. For example, the electric resistance fluctuation rate of the battery cell 11 is smaller than or equal to the preset lower limit when the internal resistance of the battery cell 11 decreases below a reference value due to an electric short circuit or the like, where the battery cell 11 is abnormally degraded. Therefore, the control unit 103 may determine the resistance increase and decrease pattern only when the battery cell 11 is degenerated normally, except the case where the battery cell 11 is degenerated abnormally due to an external factor such as an electric short.

If normal degradation and abnormal degradation of the battery cell 11 are not classified in advance, the degradation acceleration degree may be determined according to the resistance increase and decrease pattern in an abnormal degeneration condition, and the battery control condition may be adjusted according to the determined degradation acceleration degree, which may further deteriorate the state of the battery cell 11.

Accordingly, since the battery state estimating apparatus 100 according to an embodiment of the present disclosure determines the resistance increase and decrease pattern and the degradation acceleration degree only when the battery cell 11 is in a normally degraded state, there is an advantage of shortening the time required for determining the degradation acceleration degree of the battery cell 11 and improving the accuracy of determining the state of the battery cell 11.

Figure 12:
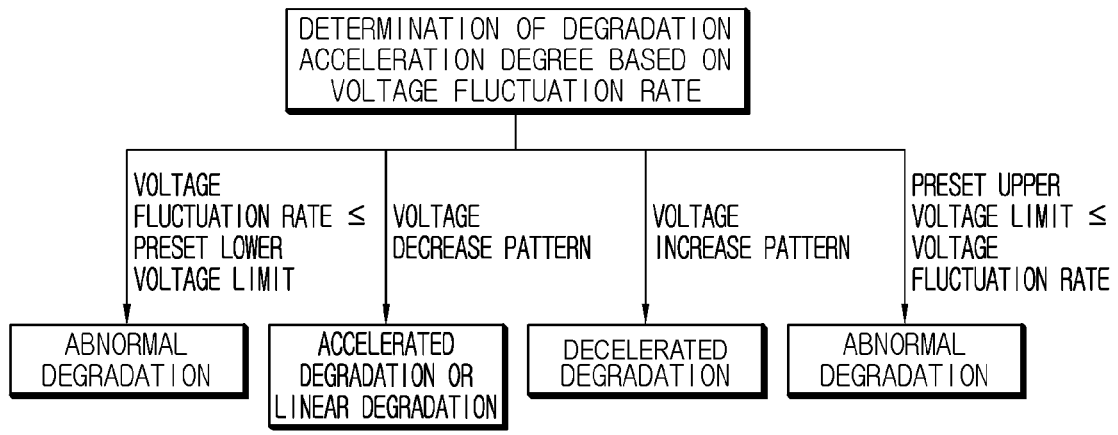
FIG. 12 is a diagram schematically showing a process of determining a degradation acceleration degree of a battery cell based on the voltage fluctuation rate by the battery state estimating apparatus according to an embodiment of the present disclosure in a tree structure.

FIG. 12 is a diagram schematically showing a process of determining a degradation acceleration degree of a battery cell based on the voltage fluctuation rate by the battery state estimating apparatus according to an embodiment of the present disclosure in a tree structure.

Referring to FIG. 12, the first degradation acceleration degree of the battery cell 11 may be determined according to the voltage increase and decrease pattern of the battery cell 11 determined by the control unit 103. First, if the voltage fluctuation rate of the battery cell 11 calculated by the control unit 103 is equal to or smaller than the preset lower voltage limit or equal to or greater than the preset upper voltage limit, it may be determined as abnormal degradation. If the battery cell 11 is determined to be abnormally degraded, the control unit 103 may not determine the voltage increase and decrease pattern based on the voltage fluctuation rate.

That is, the control unit 103 may be configured to determine the voltage increase and decrease pattern only when the voltage fluctuation rate of the battery cell 11 is included in the normal range, and to determine the first degradation acceleration degree of the battery cell 11 according to the determined voltage increase and decrease pattern.

If the voltage fluctuation rate of the battery cell 11 is greater than the preset lower voltage limit and smaller than the preset upper voltage limit, the control unit 103 may determine the voltage increase and decrease pattern of the battery cell 11 based on the calculated voltage fluctuation rate and the pre-stored voltage fluctuation rate data. In addition, if the determined voltage increase and decrease pattern is the voltage decrease pattern, the control unit 103 may determine the degradation acceleration degree of the battery cell 11 as any one of the accelerated degradation and the linear degradation, and if the determined voltage increase and decrease pattern is the voltage increase pattern, the control unit 103 may determine the degradation acceleration degree of the battery cell 11 as the decelerated degradation.

That is, if the determined voltage increase and decrease pattern is the voltage increase pattern, the control unit 103 may determine the degradation acceleration degree of the battery cell 11 only as the decelerated degradation. Conversely, if the determined voltage increase and decrease pattern is the voltage decrease pattern, the control unit 103 may compare the rate of voltage change of the battery cell 11 with the preset reference rate of voltage change to classify the degradation acceleration degree of the battery cell 11 in more detail into any one of the accelerated degradation and the linear degradation.

Figure 13:
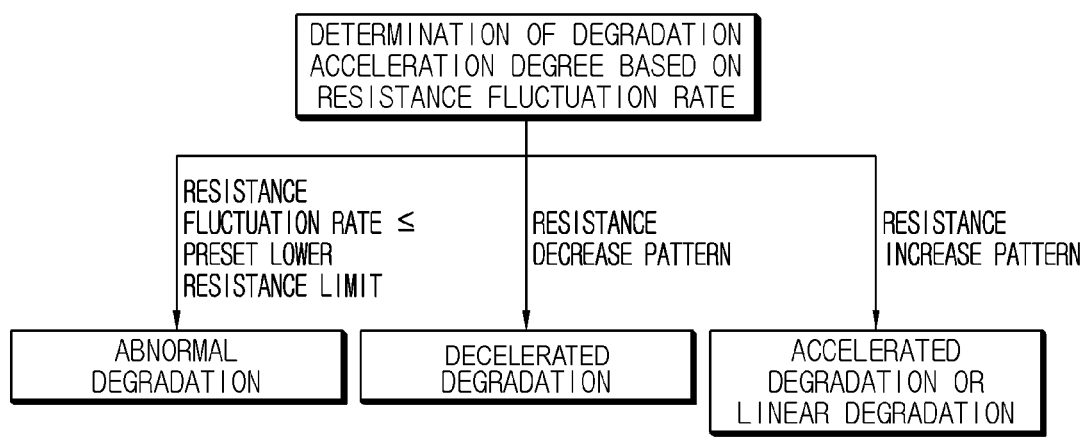
FIG. 13 is a diagram schematically showing a process of determining a degradation acceleration degree of a battery cell based on the electric resistance fluctuation rate by the battery state estimating apparatus according to an embodiment of the present disclosure in a tree structure.

FIG. 13 is a diagram schematically showing a process of determining a degradation acceleration degree of a battery cell based on the electric resistance fluctuation rate by the battery state estimating apparatus according to an embodiment of the present disclosure in a tree structure.

Referring to FIG. 13, the control unit 103 may determine the degradation acceleration degree of the battery cell 11 according to only the determined resistance increase and decrease pattern of the battery cell 11, regardless of the determined voltage increase and decrease pattern of the battery cell 11. That is, when determining the degradation acceleration degree of the battery cell 11 in a charge situation, the voltage increase and decrease pattern and the resistance increase and decrease pattern of the battery cell 11 may not affect each other. However, if the battery cell 11 is in a discharge situation, since the OCV affects the change factor of the internal resistance of the battery cell 11, the voltage increase and decrease pattern may be considered first when determining the second degradation acceleration degree according to the resistance increase and decrease pattern.

If the electric resistance fluctuation rate of the battery cell 11 calculated by the control unit 103 is equal to or smaller than the preset lower resistance limit, the control unit 103 may determine the degradation state of the battery cell 11 as abnormal degradation. The control unit 103 may not determine the degradation acceleration degree of the battery cell 11 if the degradation state of the battery cell 11 is abnormal degradation, and the control unit 103 may determine the degradation acceleration degree of the battery cell 11 only when the degradation state of the battery cell 11 is normal degradation.

If the electric resistance fluctuation rate of the battery cell 11 calculated by the control unit 103 is greater than the preset lower resistance limit, the control unit 103 may determine the resistance increase and decrease pattern based on the electric resistance fluctuation rate of the battery cell 11. Here, if the resistance increase and decrease pattern of the battery cell 11 is determined as the resistance decrease pattern, the control unit 103 may determine the second degradation acceleration degree of the battery cell 11 only as the decelerated degradation. Conversely, if the resistance increase and decrease pattern of the battery cell 11 is determined as the resistance increase pattern, the control unit 103 may determine the degradation acceleration degree of the battery cell 11 as any one of the accelerated degradation and the linear degradation based on the rate of resistance change.

That is, only when the resistance increase and decrease pattern of the battery cell 11 is determined as the resistance increase pattern, the control unit 103 may determine the present degradation acceleration degree of the battery cell 11 as any one of the accelerated degradation and the linear degradation based on the rate of resistance change of the region to which the present cycle of the battery cell 11 belongs.

The battery state estimating apparatus 100 according to an embodiment of the present disclosure may determine not only the degradation degree of the battery cell 11, namely the electric resistance fluctuation rate, but also the history of the degradation acceleration degree presently performed and the previous degradation acceleration degree. Therefore, the battery state estimating apparatus 100 may more accurately determine the present state of the battery cell 11 and further provide specific information that allows to predict a future situation such as the life of the battery cell 11.

That is, the user may check the state of each battery cell 11 more specifically by obtaining the first degradation acceleration degree according to the voltage increase and decrease pattern of the battery cell 11 and the second degradation acceleration degree according to the resistance increase and decrease pattern from the battery state estimating apparatus 100 according to an embodiment of the present disclosure, respectively. Therefore, the battery state estimating apparatus 100 may provide specific and various information about the state of the battery cell 11 by determining the degradation acceleration degree of the battery cell 11 in diversified ways using various indicators such as the voltage increase and decrease pattern and the resistance increase and decrease pattern and providing the determined information.

The battery pack 1000 according to the present disclosure may include the battery state estimating apparatus 100 according to the present disclosure described above. In addition, the battery pack 1000 according to the present disclosure may further include a battery cell, various electrical equipment (including battery management systems (BMS), relays, fuses, etc.) and a pack case, in addition to the battery state estimating apparatus 100.

In addition, as another embodiment of the present disclosure, the battery state estimating apparatus 100 may be mounted to various devices using electric energy, such as an electric vehicle, an energy storage system (ESS), and the like. In particular, the battery state estimating apparatus 100 according to the present disclosure may be included in an electric vehicle.

The electric vehicle according to the present disclosure may include the battery state estimating apparatus 100 according to the present disclosure. Here, the battery state estimating apparatus 100 may be included in the battery pack 1000 and may be implemented as a separate device from the battery pack 1000. For example, at least a part of the battery state estimating apparatus 100 may be implemented by an electronic control unit (ECU) of a vehicle.

In addition, the vehicle according to the present disclosure may include a vehicle body or electronic equipment typically provided to the vehicle, in addition to the battery state estimating apparatus 100. For example, the vehicle according to the present disclosure may include a battery pack, a contactor, an inverter, a motor, at least one ECU, and the like, in addition to the battery state estimating apparatus 100 according to the present disclosure.

However, the present disclosure is not particularly limited to other components of the vehicle other than the battery state estimating apparatus 100.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

10: battery module
11: battery cell
100: battery state estimating apparatus
1000: battery pack

What is claimed is:

1. A battery state estimating apparatus, comprising:
   a voltage measuring unit configured to:
      measure a voltage of a battery cell;
      compare the measured voltage of the battery cell to a predetermined reference charge voltage value; and
      in response to the measured voltage equaling the predetermined reference charge voltage value, measure an open circuit voltage (OCV) of the battery cell; and
   a control unit configured to:
      receive the OCV measured by the voltage measuring unit,
      calculate at least one of a voltage fluctuation rate or an electric resistance fluctuation rate based on a result obtained by processing the received OCV,
      in response to calculating the voltage fluctuation rate:
         determine a voltage increase pattern or voltage decrease pattern based on the calculated voltage fluctuation rate and pre-stored voltage fluctuation rate data; and
         determine a first degree of degradation of the battery cell according to the determined voltage increase pattern or voltage decrease pattern;
      in response to calculating the electric resistance fluctuation rate:
         determine a resistance increase pattern or resistance decrease pattern based on the calculated electric resistance fluctuation rate and pre-stored electric resistance fluctuation rate data; and
         determine a second degree of degradation of the battery cell according to the determined resistance increase pattern or resistance decrease pattern.

2. The battery state estimating apparatus according to claim 1,
   wherein the control unit is configured to calculate both (i) the voltage increase pattern or voltage decrease pattern and (ii) the resistance increase pattern or resistance decrease pattern, wherein the second determined degree of degradation is independent of the first determined degree of degradation.

3. The battery state estimating apparatus according to claim 1,
   wherein the control unit is configured to calculate the voltage fluctuation rate based on a comparison between the received OCV and a pre-stored reference voltage,
   wherein the pre-stored reference voltage is an OCV of the battery cell when the voltage of the battery cell reaches the reference charge voltage level during a predetermined cycle of the battery cell, and wherein the pre-stored voltage fluctuation rate data includes a voltage fluctuation rate previously calculated by the control unit.

4. The battery state estimating apparatus according to claim 1,
wherein the control unit is configured to determine the voltage increase pattern or voltage decrease pattern only when the calculated voltage fluctuation rate is greater than a preset lower voltage limit and smaller than a preset upper voltage limit.

5. The battery state estimating apparatus according to claim 1,
wherein the control unit is configured to:
calculate an internal resistance based on the received OCV; and
calculate the electric resistance fluctuation rate based on a comparison between the calculated internal resistance and a pre-stored reference resistance,
wherein the pre-stored reference resistance is calculated based on an OCV of the battery cell when the voltage of the battery cell reaches the reference charge voltage level during a predetermined cycle of the battery cell, and
wherein the pre-stored electric resistance fluctuation rate data includes an electric resistance fluctuation rate previously calculated by the control unit.

6. The battery state estimating apparatus according to claim 1,
wherein the control unit is configured to determine the resistance increase pattern or resistance decrease pattern only when the calculated electric resistance fluctuation rate is greater than a preset lower resistance limit.

7. A battery pack, comprising the battery state estimating apparatus according to claim 1.

8. An electric vehicle, comprising the battery state estimating apparatus according to claim 1.

9. A battery state estimating apparatus, comprising:
a voltage measuring unit configured to:
measure a voltage of a battery cell; and
measure an open circuit voltage (OCV) of the battery cell whenever the measured voltage reaches a reference charge voltage; and
a control unit configured to:
receive the OCV measured by the voltage measuring unit, calculate at least one of a voltage fluctuation rate or an electric resistance fluctuation rate based on a result obtained by processing the received OCV,
determine at least one of a voltage increase pattern or voltage decrease pattern based on the calculated voltage fluctuation rate and pre-stored voltage fluctuation rate data when the voltage fluctuation rate is calculated, or a resistance increase pattern or resistance decrease pattern based on the calculated electric resistance fluctuation rate and pre-stored electric resistance fluctuation rate data when the electric resistance fluctuation rate is calculated, and
determine one or more degrees to which degradation of the battery cell is changing according to at least one of the determined voltage increase pattern, voltage decrease pattern resistance increase pattern or resistance decrease pattern,
wherein the control unit is configured to:
calculate a plurality of voltage fluctuation rates during a present cycle of the battery cell and one or more previous cycles of the battery cell within a predetermined number of cycles from the present cycle of the battery cell among the pre-stored voltage fluctuation rate data;
calculate a rate of voltage change between the calculated plurality of voltage fluctuation rates; and
determine the voltage increase pattern or voltage decrease pattern based on the calculated rate of voltage change.

10. The battery state estimating apparatus according to claim 9,
wherein the control unit is configured to:
determine a degree to which degradation of the battery cell is changing as a decelerated degradation in response to the voltage increase pattern being calculated based on the calculated voltage fluctuation rate and pre-stored voltage fluctuation rate data, and
determine the degree to which degradation of the battery cell is changing as one of an accelerated degradation or a linear degradation in response to the voltage decrease pattern being calculated based on the calculated voltage fluctuation rate and pre-stored voltage fluctuation rate data.

11. The battery state estimating apparatus according to claim 10,
wherein the control unit is configured to:
determine the degree to which degradation of the battery cell is changing to be a linear degradation in response to the calculated rate of voltage change being equal to or greater than a preset reference rate of voltage change; and
determine the degree to which degradation of the battery cell is changing to be an accelerated degradation in response to the calculated rate of voltage change being less than a preset reference rate of voltage change.

12. A battery state estimating apparatus, comprising:
a voltage measuring unit configured to:
measure a voltage of a battery cell; and
measure an open circuit voltage (OCV) of the battery cell whenever the measured voltage reaches a reference charge voltage; and
a control unit configured to:
receive the OCV measured by the voltage measuring unit, calculate at least one of a voltage fluctuation rate or an electric resistance fluctuation rate based on a result obtained by processing the received OCV,
determine at least one of a voltage increase pattern or voltage decrease pattern based on the calculated voltage fluctuation rate and pre-stored voltage fluctuation rate data when the voltage fluctuation rate is calculated, or a resistance increase pattern or resistance decrease pattern based on the calculated electric resistance fluctuation rate and pre-stored electric resistance fluctuation rate data when the electric resistance fluctuation rate is calculated, and
determine one or more degrees to which degradation of the battery cell is changing according to at least one of the determined voltage increase pattern, voltage decrease pattern resistance increase pattern or resistance decrease pattern,
wherein the control unit is configured to:
calculate a plurality of electric resistance fluctuation rates during a present cycle of the battery cell and one or more previous cycles of the battery cell within a predetermined number of cycles from the present cycle of the battery cell among the pre-stored electric resistance fluctuation rate data;

calculate a rate of resistance change between the calculated plurality of electric resistance fluctuation rates; and determine the resistance increase pattern or resistance decrease pattern based on the calculated rate of resistance change.

13. The battery state estimating apparatus according to claim 12, wherein the control unit is configured to:

determine a degree to which degradation of the battery cell is changing as one of an accelerated degradation or a linear degradation in response to the resistance increase pattern being calculated based on the calculated electric resistance fluctuation rate and pre-stored electric resistance fluctuation rate data, and determine the degree to which degradation of the battery cell is changing as a decelerated degradation in response to the resistance decrease pattern being calculated based on the calculated electric resistance fluctuation rate and pre-stored electric resistance fluctuation rate data.

14. The battery state estimating apparatus according to claim 13, wherein the control unit is configured to:

determine the degree to which degradation of the battery cell is changing to be an accelerated degradation in response to the calculated rate of resistance change being equal to or greater than a preset reference rate of resistance change; and determine the degree to which degradation of the battery cell is changing to be a linear degradation in response to the calculated rate of resistance change being less than a preset reference rate of resistance change.

\* \* \* \* \*